United States Patent
Murata et al.

(10) Patent No.: US 10,796,031 B1
(45) Date of Patent: Oct. 6, 2020

(54) METHOD AND SYSTEM OF PREPARING ENGINEERING DATA FOR INDUSTRIAL CONTROL SYSTEMS

(71) Applicant: Yokogawa Electric Corporation, Tokyo (JP)

(72) Inventors: Hideki Murata, Singapore (SG); Mark Anthony De Castro Cu-Unjieng, Singapore (SG); Naing Oo Lin, Singapore (SG); Archie Sambitan Orido, Singapore (SG); Efendi Supiman, Singapore (SG); Thin Sapal Yu, Singapore (SG); Janet Tria, Singapore (SG)

(73) Assignee: Yokogawa Electric Corporation, Tokyo (JP)

( * ) Notice: Subject to any disclaimer, the term of this patent is extended or adjusted under 35 U.S.C. 154(b) by 7 days.

(21) Appl. No.: 16/359,014

(22) Filed: Mar. 20, 2019

(51) Int. Cl.
*G06F 30/00* (2020.01)
*G06F 8/20* (2018.01)
*G06F 8/35* (2018.01)

(52) U.S. Cl.
CPC .............. *G06F 30/00* (2020.01); *G06F 8/20* (2013.01); *G06F 8/35* (2013.01)

(58) Field of Classification Search
None
See application file for complete search history.

(56) References Cited

U.S. PATENT DOCUMENTS

| | | | | |
|---|---|---|---|---|
| 7,089,530 B1 * | 8/2006 | Dardinski | ............. | G05B 15/02 700/83 |
| 7,890,927 B2 * | 2/2011 | Eldridge | ................ | G05B 15/02 700/86 |
| 9,411,798 B1 * | 8/2016 | He | ......................... | G06F 16/248 |
| 2005/0198615 A1 * | 9/2005 | Choi | ......................... | G06F 8/24 717/108 |
| 2011/0023011 A1 * | 1/2011 | Khader | ..................... | G06F 8/71 717/106 |
| 2015/0040234 A1 * | 2/2015 | Grack | ................... | G06F 21/604 726/26 |
| 2016/0132037 A1 * | 5/2016 | Weng | ................. | G05B 19/0426 700/87 |

(Continued)

OTHER PUBLICATIONS

Search Report dated Jun. 15, 2020, issued by the European Patent Office in application No. 20 15 1553.

*Primary Examiner* — Philip Wang
(74) *Attorney, Agent, or Firm* — Sughrue Mion, PLLC

(57) ABSTRACT

An industrial plant module-based engineering method includes the following processes. The process is for duplicating a source engineering template having one or more source child templates to create a duplicated engineering template having one or more duplicated child templates, without duplicating any instances. The process is for selecting at least one child instance instantiated from the source engineering template and having an original link to the source engineering template. The process is for changing the original link into a new link between the selected at least one child instance and the duplicated engineering template. The selected at least one child instance has the new link to the duplicated engineering template and is free of the original link to the source engineering template, and wherein unselected one or more child instances remain to have the original link to the source engineering template.

28 Claims, 10 Drawing Sheets

(56) References Cited

U.S. PATENT DOCUMENTS

2016/0132047 A1* 5/2016 Kambe ............ G05B 19/41845
   700/87
2016/0132048 A1* 5/2016 Kambe ............ G05B 19/41845
   700/87
2017/0308360 A1* 10/2017 Kambach ................. G06F 8/71
2018/0046339 A1 2/2018 Naidoo et al.
2018/0364960 A1* 12/2018 Downs ................. G06F 3/1204

* cited by examiner

METHOD AND SYSTEM OF PREPARING ENGINEERING DATA FOR INDUSTRIAL CONTROL SYSTEMS

TECHNICAL FIELD

Embodiments of the present invention generally relate to a method and a system for configuring or engineering process control systems, and more particularly relate to a method and a system for efficiently preparing and modifying engineering data for process control systems of an industrial plant.

BACKGROUND ART

[Overall of Module-Based Engineering]

In an industrial plant, a module-based engineering is useful for automation design by configuring and maintaining overall plant control systems, including plant instrumentation, safety instrumentation, and maintenance management. In general, servers of automation engineering systems centrally manage database of engineering data, which makes design information available for expanding, modifying, or maintaining the plant control system, and saves unnecessary manpower for fixing inconsistency between the design information and actual information stored in the plant control system. The module-based engineering refers to an engineering method to design control applications and alarms by transforming control logic and design information into modules and then combining the modules in the server of the automation engineering system. The modules, which may generally consist of independent software components such as customer information and know-hows gathered from the past design pattern experiences, may also include control logics, alarm attributes, and design information. Reuse of the modules configured in previous projects can improve engineering quality and reduce engineering time, which contributes to shorten the project period. FIG. 1 is a schematic diagram of a general concept of module-based engineering for automation design. As shown in FIG. 1, modules can be configured, registered to, and downloaded from the server of the automation engineering system by an engineering tool of the automation engineering system. The engineering design information is saved to create a summary document of the engineering results. In addition, the module-based engineering can be concurrently performed with the following engineering tasks: I/O design, control application design, and system configuration design.

In the module-based engineering, control logic, alarm attribute, design information, and attachments are treated as a module. The modules may generally include: design information; control logic; tuning parameters; alarm attributes; and attachments. Design information, such as functional specifications, may be defined as a module component. The design information may generally include texts, images, and tables that explain the details of the module. Control logic may include a control drawing and detailed definitions of functional blocks, switches, and messages. The control logic may be defined in a class module or an application module. Module-based engineering may allow tuning parameters to be treated as module components by bulk editing of tuning parameter design values in functional blocks defined in control logic of a field control system, and by comparing and setting tuning parameter design values and current values of a field control system. The field control system may be a hardware I/O Controller. Alarm attributes may be alarm setting values and alarm priorities. An arbitrary file can be attached as a module component. The list of attachments can be launched by a simple operation.

There are two types of modules available for module-based engineering, for example, a class module and an application module. The class module is used as a template for a control application, and the application module acts as an actual control application. The class module is a template. Based on the class module, an application module to perform an actual control application can be created. The application module maintains the relationship with the class module which is used as a template, and changes made to the class module are reflected to the application module. A single module is used as a template for multiple application modules. The application module performs a control application by assigning I/O and tag name to the application module. There are two types of application modules available, for example, a class-based application module created based on a class module, and a class-less application module created without using a class module.

The module-based engineering may allow designing of I/O, control applications, and system configuration in parallel, which enables to start designing control applications and I/O before finalizing the system configurations. Even after designing control applications, the I/O designs may be changed flexibly. Plant information contains various kinds of information for implementing control systems engineering. In the module-based engineering, I/O may be designed based on obtained I/O information of a plant. In general, engineering tools of the automation engineering system may be used for designing I/O to configure plant I/O information into a table-format I/O information list. The I/O information list defines information such as I/O tag names, I/O module types, and FCS station names where I/O modules are mounted, as well as the specific information of each I/O. The I/O information list can be exported and/or imported. The setting information of the I/O information list may be edited on an exported external file, and the setting information may be imported to the engineering tool of the automation engineering system. A class module is firstly created as needed. Then an application module is created using or not using the class module. The engineering tool of the automation engineering system is used for engineering of the control application design. An I/O tag name is given to an I/O terminal of the application module. An actual tag name is applied for the functional block of the application module. Since a control application is created based on the I/O tag name, the control application can be created prior to completion of the I/O design such as I/O module assignment information or specific information of each I/O.

Engineering of items other than designing I/O and control applications are done by designing system configuration such as field control stations (FCS) and human interface stations (HIS) as well as items common for the project and relevant to stations. These items are configured by a system view. The engineering tool of the automation engineering system is used for setting switches such as common switch, global switch, annunciator, signal event, operator guide messages, and printing messages. The engineering data of the I/O design and control application design created in the engineering tool of the automation engineering system independently of the system configuration are eventually assigned to a field control station (FCS) and generated as any project data. The engineering for process I/O, serial communication Ethernet communication completes when a project data is completed.

When module-based engineering is finished by completing the project data, the control applications test is conducted by using a predefined set of test functions. Functions to support module-based engineering include document generation function, bulk editing function, tuning parameter management function. The document generation function is to integrate design information of a module and various engineering data to generate a single document file. The tuning parameter management function is to manage the functional block tuning parameter values designed when creating control applications and current tuning parameter values of the field control systems. The bulk editing function is to collectively edit control logics and alarm attributes of the modules designed while configuring control applications.

SUMMARY

In some aspects, In some embodiments, an industrial plant module-based engineering method may include, but is not limited to, duplicating a source engineering template; selecting at least one child instance, changing the original link into a new link. The process for duplicating a source engineering template may include, but is not limited to, duplicating a source engineering template having one or more source child templates to create a duplicated engineering template having one or more duplicated child templates which correspond to the one or more source child templates, respectively, without duplicating any instances with one or more child instances which have been instantiated from the one or more source child templates in the source engineering template, wherein the duplicated engineering template is free of any instances and wherein each of the one or more child instances has an original link to the source engineering template. The process for selecting at least one child instance may include, but is not limited to, selecting at least one child instance among one or more child instances which have been instantiated from the source engineering template, wherein the selected at least one child instance has an original link to the source engineering template. The process for changing the original link into a new link may include, but is not limited to, changing the original link into a new link between the selected at least one child instance and the duplicated engineering template, wherein the selected at least one child instance has the new link to the duplicated engineering template and is free of the original link to the source engineering template, and wherein unselected one or more child instances remain to have the original link to the source engineering template.

EMBODIMENTS

Figure 1:
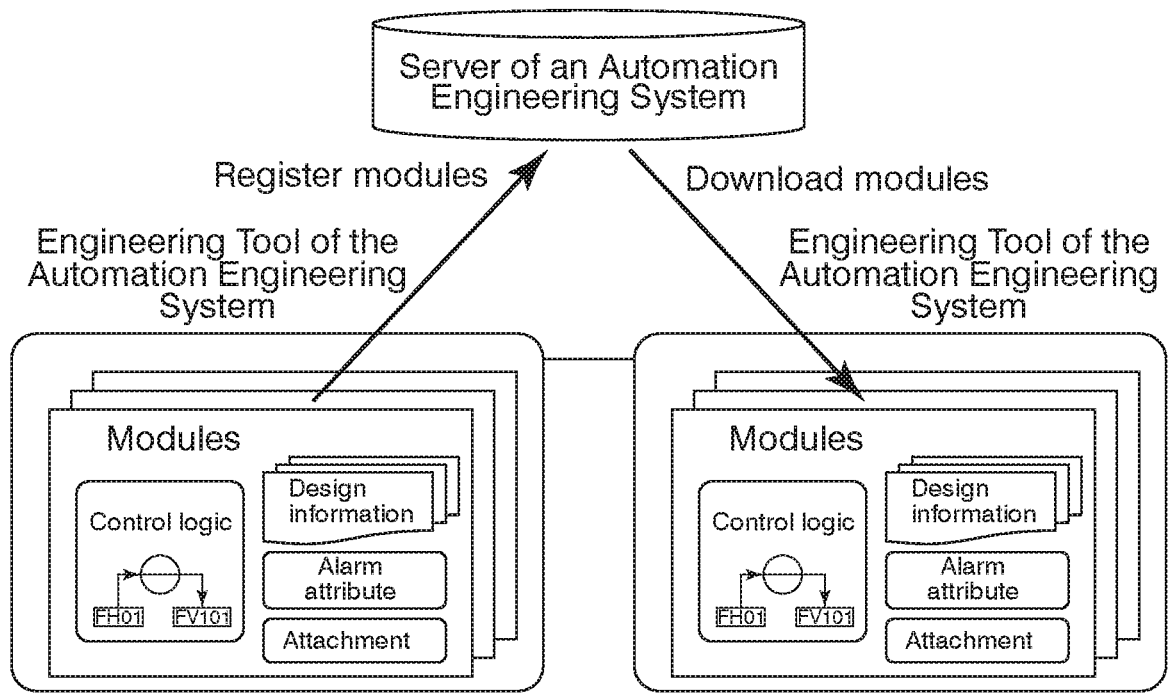
FIG. 1 is a schematic diagram of a general concept of module-based engineering for automation design.

In some embodiments, an industrial plant module-based engineering method may include, but is not limited to, duplicating a source engineering template; selecting at least one child instance, changing the original link into a new link. The process for duplicating a source engineering template may include, but is not limited to, duplicating a source engineering template having one or more source child templates to create a duplicated engineering template having one or more duplicated child templates which correspond to the one or more source child templates, respectively, without duplicating any instances with one or more child instances which have been instantiated from the one or more source child templates in the source engineering template, wherein the duplicated engineering template is free of any instances and wherein each of the one or more child instances has an original link to the source engineering template. The process for selecting at least one child instance may include, but is not limited to, selecting at least one child instance among one or more child instances which have been instantiated from the source engineering template, wherein the selected at least one child instance has an original link to the source engineering template. The process for changing the original link into a new link may include, but is not limited to, changing the original link into a new link between the selected at least one child instance and the duplicated engineering template, wherein the selected at least one child instance has the new link to the duplicated engineering template and is free of the original link to the source engineering template, and wherein unselected one or more child instances remain to have the original link to the source engineering template.

In some cases, the industrial plant module-based engineering method may further include, but is not limited to, instantiating the source engineering template having the one or more source child templates to create one or more instances which each have one or more child instances before duplicating the source engineering template having the one or more source child templates.

In some cases, the source engineering template having the one or more source child templates may include, but is not limited to, a source group class module having one or more source child class modules which have links to a source class module, and wherein the one or more child instances, which have been instantiated from the source engineering template, may include, but is not limited to, one or more child application modules having links to the source class module.

In some cases, the industrial plant module-based engineering method may further include, but is not limited to, instantiating the source class module to create one or more class-based application modules which have links to the source class module.

In some cases, the industrial plant module-based engineering method may further include, but is not limited to, duplicating the source class module to create a duplicated class module.

In some cases, the industrial plant module-based engineering method may further include, but is not limited to, changing, after duplicating the source class module to have created a duplicated class module, the link between a selected class-based application module of the one or more class-based application modules and the source class module into a link between the selected class-based application module and the duplicated class module.

In some cases, the industrial plant module-based engineering method may further include, but is not limited to, changing, after duplicating the source class module to have created the duplicated class module, the link between a selected child application module of the one or more child application modules and the source class module into a link between the selected child application module and the duplicated class module.

In some cases, the industrial plant module-based engineering method may further include, but is not limited to, duplicating the source group class module having one or more source child class modules which have links to a source class module to create a duplicated group class module having the one or more source child class modules which have links to the source class module.

In some cases, the industrial plant module-based engineering method may further include, but is not limited to, instantiating the source group class module having the one or more source child class modules to create one or more group application modules which have links to the source group class module, wherein the one or more group application modules have one or more child application modules links to the source class module.

In some cases, the industrial plant module-based engineering method may further include, but is not limited to, changing, after instantiating the source group class module to have created the one or more group application modules, the link between a selected group application module of the one or more group application modules and the source group class module into a link between the selected group application module and the duplicated group class module.

In some cases, the industrial plant module-based engineering method may further include, but is not limited to, changing, after changing the link between the selected group application module and the source group class module into the link between the selected group application module and the duplicated group class module, the link between a selected child application module of the one or more child application modules of the selected group application module and the source child class module into a link between the selected child application module and the duplicated child class module.

In some cases, the industrial plant module-based engineering method may further include, but is not limited to, changing, after duplicating the source class module to have created a duplicated class module, the link between a selected class-based application module of the one or more class-based application modules and the source class module into a link between the selected class-based application module and the duplicated class module.

In some cases, the industrial plant module-based engineering method may further include, but is not limited to, changing, after duplicating the source class module to have created the duplicated class module, the link between a selected child application module of the one or more child application modules and the source class module into a link between the selected child application module and the duplicated class module.

In some cases, each group class module includes at least one allocation which defines: i) groupings of a plurality of class modules; and ii) assignments of the class modules to multiple drawings to define complex loops of multiple logical control module drawings.

In some cases, instantiating the source group class module may include, but is not limited to: instantiating the source group class module with reflecting a hierarchy of the source group class modules to generate, in an application structure navigator, a group application module and a hierarchy of the group application module from the group class module; and instantiating the child class module to generate, in the application structure navigator, a child application module from the child class module.

In some cases, the industrial plant module-based engineering method may further include, but is not limited to, updating the allocation of each group class module and a respective topology of the complex loops of each group class module, and the group module update engine configured to update an allocation of each group application module and a respective topology of the complex loops of each group application module.

In some cases, the industrial plant module-based engineering method may further include, but is not limited to, binding, based on the at least one allocation of the group class module, the group application module and a legacy application module (legacy APM) to drawings of field controllers in an industrial plant, wherein the legacy application module is at least one of: iii) a class-based application module which refers to a source class module: and iv) a classless application module which does not refer to any source class module.

In some cases, each group class module has a plurality of child class modules, folders, and a hierarchy of the child class modules and the folders.

In some cases, wherein each group class module may further include, but is not limited to, a design document information which is used to generate a document of module design; an attachment which is used to store artifacts related to the class module; and the allocation which defines groupings of class modules and assignments of the class modules to plural control drawings to define complex loops for drawings of field control systems.

In some cases, the class module may further include, but is not limited to, a design document information which is used to generate a document of module design; an attachment which is used to store artifacts related to the class module; a control logic that contains a logic information of process control; an alarm attribute; and turning parameters.

In some cases, the industrial plant module-based engineering method may further include, but is not limited to, selecting part of the child class modules to be not instantiated, to generate a set of different group application modules from a single group class module.

In some cases, the industrial plant module-based engineering method may further include, but is not limited to, assigning the multiple logical control drawings, which are defined in each group class module, to a respective one of a plurality of physical field control systems.

In some cases, the industrial plant module-based engineering method may further include, but is not limited to, performing at least one of addition and deletion of the child application module which refers to the group application module that is instantiated from the group class module, in case that the group module update engine updates the respective topology of the complex loops of the group class module.

In some cases, the industrial plant module-based engineering method may further include, but is not limited to, updating contents of the child application module which refers to the group application module that is instantiated from the group class module, in case that the group module update engine updates the respective topology of the complex loops of the group class module.

In some cases, the industrial plant module-based engineering method may further include, but is not limited to, performing at least one of addition and deletion of the child application module which refers to the group application module that is instantiated from the group class module, in case that the group module update engine updates the respective topology of the complex loops of each group application module.

In some cases, the industrial plant module-based engineering method may further include, but is not limited to, updating contents of the child application module which refers to the group application module that is instantiated from the group class module, in case that the group module update engine updates the respective topology of the complex loops of each group application module.

In some cases, each group application module includes at least one allocation which defines: iii) groupings of application modules; and iv) assignments of the application modules to multiple control drawings to define complex loops of multiple logical control drawings.

In some cases, the industrial plant module-based engineering method may further include, but is not limited to, updating the allocation of each group application module and the respective topology of the complex loops of each group application module if the group module update engine updated the allocation of each group class module and the respective topology of the complex loops of each group class module.

Disclosures hereinafter describe two types of module-based engineering methods, one using normal class modules, and other using group class modules. The scope of the normal class module-based engineering covers the lowest level in hierarchy. For example, the scope of the normal class module-based engineering covers only regulatory simple loop of control module drawings but does not cover any complex loop of control module drawings, equipment module drawings and/or unit drawings. Grouping of the class modules for control module drawings in terms of characteristics and behaviour of a class-module-based object oriented to instantiate will expand the scope and allow that the scope of the group class module-based engineering covers not only the regulatory simple loop of control module drawings at the lowest hierarchy level but also the complex loop of drawings at higher hierarchy levels. The scope of the group class module-based engineering is wider than the scope of the normal class module-based engineering.

Instantiation is a process for creating a particular instance of a class.

Instantiation of a class is a process for generating an object.

An object is an instance of a class. An object is generated by instantiating a class.

A group application module (group APM) is an instance of a group class module.

A child application module (child APM) is an instance of a child class module which is a shortcut or reference to a class module.

A class is an extensible program-code-template for creating objects, providing initial values for state member variables and implementations of behavior. The class module is a reusable template. The class module contains engineering logic data, alarm attributes and tuning parameters to define its default sets of parameters and module rules to dynamically set values to parameters during instantiation. A class is also a template for containing sets of instructions and properties or references to other objects. Class module cannot refer to another class module unlike class which can contain references to another Class.

Instantiation of a class module is a process for generating a class-based application module.

A class-based application module is the instance of the class module.

An object, which is generated by instantiating a class, is composed of a combination of variables, functions, and data structures, or a data type that is composed of a collection of names or keys and values.

A control loop is a group of components working together as a system to achieve and maintain the desired value of a system variable by manipulating the value of another variable in the control loop. Each control loop has at least an input and an output. There are two types of control loop, open loop and closed loop.

A group is a container for classes which creates or forms logical structure or topology in order to define relationships between class modules. But unlike class, a group module can be instantiated with partial structure while a class is instantiated always with the whole structure for its objects.

A group class module allows expanding the benefits of module engineering to enhance its reusability and convenience by grouping complex loops of multiple control drawings.

[Module-Based Engineering without Branching Engineering Template]

Industrial controllers are designed for controlling industrial processes or manufacturing environment. Industrial controllers typically require control programs or control logics to be uniquely designed for a particular industrial process. To change or configure the control logics of the controllers, users/engineers could use an editor tool such as automated design organizer of an automated engineering system to prepare and modify the engineering data or design data of the controllers of an industrial plant. In practice, control logics need to be changed from time to time to meet various design needs and operational requirements of an industrial plant.

To this end, by way of an example, engineers create and use an engineering template (source parent), the engineering template herein could be understood as a class module, which typically contains generic control logics of design information. Further, multiple application modules as instances could be created based on the engineering template as the class module.

The engineering template and engineering data are tested and deployed to a system project later. A system projects refers to a group of data wherein the engineering data is stored. During testing, engineering data may require to be changed to support additional customer's requirements. In response to such requirements, the instances as application modules will need to be changed.

Once the instances as application modules have been changed, the relationship or link between the engineering template and child instances will be broken and reusability of engineering template is no longer available. In the existing practice, if engineers and/or users need to perform modifications with respect to the instances, they need to unlink the engineering template with its instances, before performing the modifications with respect to each instance individually. These processes are time-consuming and error-prone, since modifications have to be performed with respect to each instance one by one. Further, since the links between each instance to be modified and the source engineering template have been broken, the instances will become class-less application modules without referring to any source engineering template.

Figure 2A:
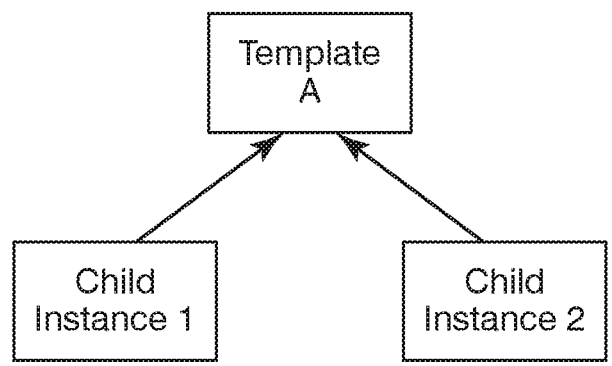
FIG. 2A is a schematic diagram of a general concept of relations between a source template module and a plurality of child instances which refer to/are associated with the source template module in related art.
Figure 2B:
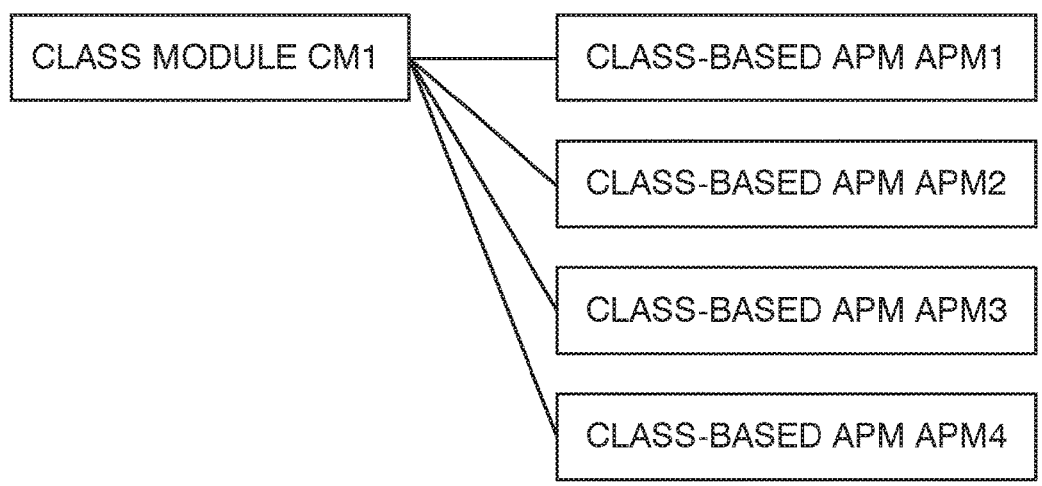
FIG. 2B is a schematic diagram of a general concept of relations between a class module as a source template module and a plurality of class-based application modules, which commonly link to, or refer to the class module as the source template module.

FIG. 2A is a schematic diagram of a general concept of relations between a source template module and a plurality of child instances which refer to/are associated with the source template module in related art. FIG. 2B is a schematic diagram of a general concept of relations between a class module 1 (CM1) as a source template module and a plurality of class-based application modules 1, 2, 3, and 4 (class-based APM1, APM2, APM3, and APM4), which commonly link to, or refer to the class module 1 (CM1) as the source template module.

A class module could be understood as an engineering template, and multiple class-based application modules/instances 1, 2, 3, and 4 (APM1, APM2, APM3, and APM4) could be created based on a class module. By way of an example, multiple class-based application modules/instances 1, 2, 3, and 4 (APM1, APM2, APM3, and APM4) are instantiated based on a class module 1 (CM1), and engineers have to break the relationships or links between the class module 1 (CM1) and the multiple class-based application modules 1, 2, 3, and 4 (APM1, APM2, APM3, and APM4) as its instances, in order to perform modifications with respect to each child instance after instantiation.

Once part or all of the multiple class-based application modules/instances 1, 2, 3, and 4 (class-based APM1, APM2, APM3, and APM4) have been changed, the relationships or links between the class module 1 (CM1) as engineering template and child instances in the class-based application modules 1, 2, 3, and 4 (APM1, APM2, APM3, and APM4) will be broken and the relationships or links are no longer available. Thus, the reusability of the class module 1 (CM1) will not be available. In the existing practice, if engineers or users need to perform modifications with respect to part or all of the multiple class-based application modules 1, 2, 3, and 4 (class-based APM1, APM2, APM3, and APM4) as instances, the engineers or users need to unlink the class module 1 (CM1) as engineering template from part or all of the multiple class-based application modules 1, 2, 3, and 4 (class-based APM1, APM2, APM3, and APM4) as the instances, so that the part or all of the multiple class-based application modules 1, 2, 3, and 4 (class-based APM1, APM2, APM3, and APM4) will become multiple classless application modules 1, 2, 3, and 4 (classless APM1, APM2, APM3, and APM4), before performing the modifications with respect to each classless instance individually. These processes are complicated, time-consuming and error-prone.

In summary, engineers create a source engineering template (source parent), which typically contains generic control logics of design information, and then change and/or configure engineering data as child instances, based on the source engineering template (source parent).

The source engineering template and engineering data as child instances are tested and deployed to a system project later. During testing, engineering data is required to change to support additional customer's requirements. In response to such requirements, the engineers normally have to update the changes on child instances.

As a result, the relationship between the template and child instances are broken and reusability of engineering template is not possible. Once the links are broken, the instances will be become class-less application modules which has no source template, and engineers then need to perform updates individually. Additionally, as the linkage is broken, some of the existing logics will also be affected.

[Class-Based/Group Class-Based Module Engineering with Branching Engineering Template]

To improve reusability and engineering efficiency, a branching process is effective for branching out one or more new engineering templates (new parents) from the existing engineering template or a source engineering template. Engineers may branch out a new engineering template (a new parent) from the existing template. The engineers are allowed to choose which engineering data as child instances to be included during branching through user's selection via branching group class module dialog. Once branching is successful, respective child instances will refer to the new parent, so that the engineers can configure additional data on the new engineering template instead of directly updating on the child instances.

Specifically, in the module-based engineering, the group class module can be understood as an engineering template, which includes design information, attachment list and allocation. Each group class module consists of multiple class modules, folders and their hierarchies.

Each group class module can be instantiated to one or more group application modules (group APMs). Each group application module (group APM) also contains design information, attachment and allocation. Similarly, each class module is to be instantiated as a class-based application module (class-based APM), which contains control logics, tuning parameter, alarm attributes from the template, design information and attachment.

Design information is used in document generation function where the design of the module may be published to a word document.

Attachment is used to store relevant artifacts related to the class module. Artifacts can be any binary files.

A control logic contains the logic information of process control. The contents of the control logic are to engineer the control drawing and function block detail definition.

The contents of alarm attributes are to engineer the alarm attributes of function block and the alarm attributes handled in an alarm system for operation stations (HIS).

The contents of tuning parameters are to engineer design values of control-related tuning parameters.

Each group class module composed of 1) design information, 2) attachment, and 3) allocation. Design information and attachments are similar function as in a class module, which are intended for documentations while the allocation defines the groupings of class modules and their assignments to multiple control drawings in order to define the complex loops.

Child class modules include shortcuts to class modules. Child class modules define and form the logic of complex loops in a group module.

Group class module can define its own topology to represent logical structure for a control and/or equipment module or unit.

[Branching Process for Branching Source Engineering Template after Instantiating Source Engineering Template]

Branching process refers to a process for 1) duplicating a source engineering template having one or more source child templates to create a duplicated engineering template having one or more duplicated child templates which correspond to the one or more source child templates, respectively, without duplicating any instances with one or more child instances which have been instantiated from the one or more source child templates in the source engineering template, wherein the duplicated engineering template is free of any instances and wherein each of the one or more child instances has an original link to the source engineering template; 2) selecting at least one child instance among one or more child instances which have been instantiated from the source engineering template, wherein the selected at least one child instance has an original link to the source engineering template; and 3) changing the original link into a new link between the selected at least one child instance and the duplicated engineering template, wherein the selected at least one child instance has the new link to the duplicated engineering template and is free of the original link to the source engineering template, and wherein unselected one or more child instances remain to have the original link to the source engineering template. The duplicating process is performed after instantiating the source engineering template having the one or more source child templates to create one or more instances which each have one or more child instances. In some cases, a template may be, but is not limited to, a class-module or a group class module.

In addition, an additional instantiation process is performed for instantiating the duplicated engineering template to create an additional instance which has one or more child instances from the duplicated engineering template wherein the one or more child instances have a link or links to the duplicated engineering template.

Figure 3:
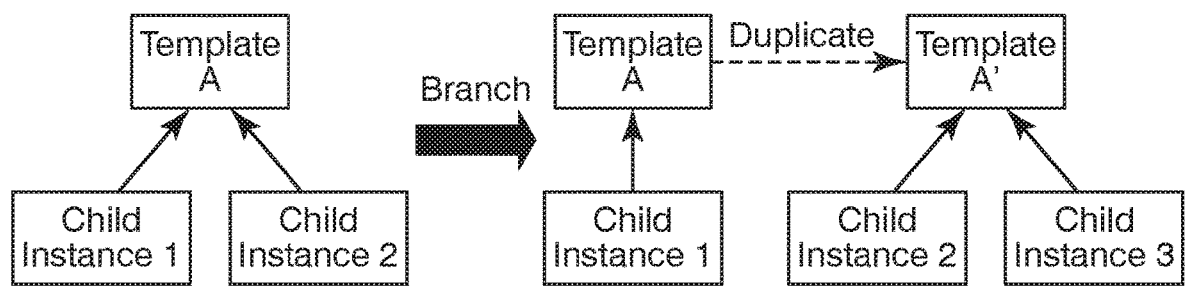
FIG. 3 is a schematic view of an illustrative example of the overall concept of branching process for branching source engineering template after instantiating source engineering template.

FIG. 3 is a schematic view of an illustrative example of the overall concept of branching process for branching source engineering template after instantiating source engineering template.

First, an engineering template preparing process is performed for preparing a source engineering template "Template A" having one or more source child templates, wherein each of the one or more source child templates has a respective shortcut or reference to the source engineering template.

Second, an instantiation process is performed for instantiating the source engineering template "Template A" having the one or more source child templates, to create one or more source instances, which each have one or more child instances, "Child Instance 1" and "Child Instance 2" from the one or more source child templates in the source engineering template "Template A".

Third, a branching process is performed which includes the following three sub-processes.

A duplication process as a first branching sub-process is performed for duplicating the source engineering template having the one or more source child templates to create a duplicated engineering template "Template A'" having one or more duplicated child templates which correspond to the one or more source child templates, respectively, without duplicating one or more child instances "Child Instance 1" and "Child Instance 2" which have been instantiated from the one or more source child templates in the source engineering template "Template A", wherein the duplicated engineering template "Template A'" is free of any instances, and wherein each of the one or more child instances has an original link to the source engineering template. Namely, immediately after duplicating the source engineering template to have created the duplicated engineering template "Template A'", the duplicated engineering template "Template A'" is free of any instances, and wherein each of the one or more child instances has an original link to the source engineering template.

A selection process as a second branching sub-process is performed for selecting at least one child instance among the one or more child instances "Child Instance 1" and "Child Instance 2" which have been instantiated from the one or more source child templates in the source engineering template "Template A", wherein the duplicated engineering template "Template A'" is free of any instances, and wherein the selected at least one child instance has an original link to the source engineering template.

A link changing process as a third branching sub-process is performed for changing the original link into a new link between the selected at least one child instance and the duplicated engineering template, wherein the selected at least one child instance has the new link to the duplicated engineering template and is free of the original link to the source engineering template, and wherein unselected one or more child instances remain to have the original link to the source engineering template. The link changing process may include two sub-processes for unlinking the selected at least one or more child instances with the source engineering template, and subsequently linking the selected at least one or more child instances with the duplicated engineering template.

Fourth, an additional instantiation process is performed for instantiating the duplicated engineering template "Template A'" to create an additional instance, "Child Instance 3", which has one or more child instances, from the duplicated engineering template "Template A'", wherein the one or more child instances have a link or links to the duplicated engineering template "Template A'".

As described above, the branching process includes not just duplicating the source engineering template (source engineering "Template A"), but also allowing engineers to select the instances or application modules such as child application module (child AMP), and automatically generating linkage/relationships between the duplicated engineering template ("Template A'") and the selected instances or child application module (child AMP) and allowing for breaking or isolating the child instances ("Child Instance 1" and "Child Instance 2"). Specifically, the child instance 1 ("Child Instance 1") will remain with the source engineering template ("Template A"), while the child instance 2 ("Child Instance 2") will be selected to link with the duplicated engineering template ("Template A'"). As a result, the modifications to child instances ("Child Instance 1" and "Child Instance 2") which are linked with the source engineering template "A" and the new duplicated engineering template "A'", respectively, are isolated without affecting each other. In contrast, if without the current branching process, the modifications to child instances ("Child Instance 1" and "Child Instance 2") which are linked with the source engineering template "A" are inter-related and affect each other. Therefore, if branching process is not available, thus as a first step the linkage between the source engineering template (Template A) and the modification target child instance ("Child Instance 2") needs to be broken before the modifications to the modification target child instance ("Child Instance 2"). By contrast, if branching process is available, the source engineering template "A" is duplicated to create the new duplicated engineering template "A'" and the link of the child instance ("Child Instance 2") to the source engineering template "A" is changed into a new link of the child instance ("Child Instance 2") to the new duplicated engineering template "A'", instead of breaking the linkage, so that the modification target child instance ("Child Instance 2") will still be class-based and still have linkage to the duplicated engineering template A', while the other or non-modification-target child instances will be class-based and still have linkage to the source engineering template "A". The modification target child instance ("Child Instance 2") which is linked to the duplicated engineering template A' needs not to be instantiated. Therefore, engineering work could be significantly reduced. If, however, new or additional child instances are needed, the duplicated engineering template A' can optionally be instantiated to create a new additional child instance which is linked to the duplicated engineering template A' without affecting the source engineering template

[Branching of Group Class Module]

Among extending group class modules (group CMs), one group class module is selected as a source group class module (source group CM), wherein the source group class module is to be duplicated to create one or more new, duplicated group class modules. The selected group class module will hereinafter be referred to as a source group class module (source group CM). After the one or more new, duplicated group class modules are created from the source group class module (source group CM), engineers or users can use a link generation tool to select, among the group application modules (group APMs) which are instantiated from, and linked with, the source group class module (source group CM), one or more group application modules (group APMs) to be linked with the new, duplicated group class module (duplicated group CM). Engineers or users can use a link generation tool, which is configured to allow engineers or users to select one or more group application modules (group APMs). The link generation tool is configured to unlink the selected one or more group application modules (group APMs) from the source group class module (source group CM) and link the selected one or more group application modules (group APMs) to the new, duplicated group class module (duplicated group CM), which has been duplicated from the source group class module (source group CM). The link generation tool is configured to automatically perform unlinking and linking the selected one or more group application modules (group APMs), upon selection by engineers or users. The link generation tool is configured to automatically generate a new link between the selected one or more group application modules (group APMs) and the new, duplicated group class module (duplicated group CM).

After duplication and selection, the instantiated group application modules (group APMs), which are originally linked to the source group class module (source group CM) will be able to refer to or be linked with the duplicated group class modules (duplicated group CM), instead of the source group class module. To be specific, the linkage/link between duplicated group class module (duplicated group CM) and the corresponding selected group application modules (Group APMs) will be automatically generated and stored in a database, which is the server of the automation engineering system.

Engineers may change and configure the engineering data directly on the duplicated group class modules (duplicated group CMs), referred as new engineering template (new parent). The module update process needs to be performed to make changes to the instances, which are created based on the new engineering template. Details for the module update will be described later. In such a way that changes could be preserved on the new duplicated template and reusability of engineering template such as group class modules (group CMs) is increased. If there are similar projects, the engineers may reuse either the existing template such as source group class module (source group CM) or the new, duplicated template such as the duplicated group class module (duplicated group CM) based on various design requirements.

The above described branching process will provide the following sets of advantages.

The branching process will enable isolation and concurrent work by multiple teams on the same project.

The branching process will reduce risks of human errors when updating each instance individually after unlinking, which are introduced by different sets of changes to engineering data such as child instances directly.

The branching process will effectively support subsequent isolated changes on different engineering templates based on some customer's requirements, wherein some of the existing logics could be branched out, therefore reducing the engineering workload in case that some changes are required during some required tests such as factory acceptance testing (FAT) or engineering phases.

The branching process will enable data releases and get immediate feedback from customers.

By branching out and performing engineering work on different engineering templates, some of the existing logics will not be affected.

Whereas the above descriptions have been made in case of branching out the group class modules, the branching process can be applied to class modules.

[Branching of Class Module]

The branching process can be applied to class modules. A class module can be duplicated by users, which means that multiple class modules can be created based on one source class module. Users can use any available user interface to select, for instance, which class-based application modules (class-based APMs), which child class module (child CMs) and/or child application modules (child APMs) to be linked with the duplicated class module, instead of the source class module.

After duplication and selection, the selected class-based application modules (class-based APMs), child class modules and/or child application modules (child APMs) which are originally linked to the source class module (source CM) will be able to refer to or be linked with the new, duplicated class module, rather than the source class module. Specifically, the linkage/link between "duplicated class module" and the corresponding selected class-based application module APMs, child class modules and/or child application modules (child APMs) will be automatically generated and stored in a database such as the server of the automation engineering system. The link generation component is also configured to generate a link between the duplicated class module and the selected class-based application modules (class-based APMs), child class modules and/or child application modules (child APMs).

Engineers can change and configure engineering data directly on the duplicated class modules. In such a way that the changes as made will be preserved on the new, duplicated engineering template and reusability of the engineering template such as class module (CM) is increased. If there are similar projects, the engineers can reuse either the existing template such as source class module (source CM) or new, duplicated template (duplicated CM) based on design requirements.

Figure 4:
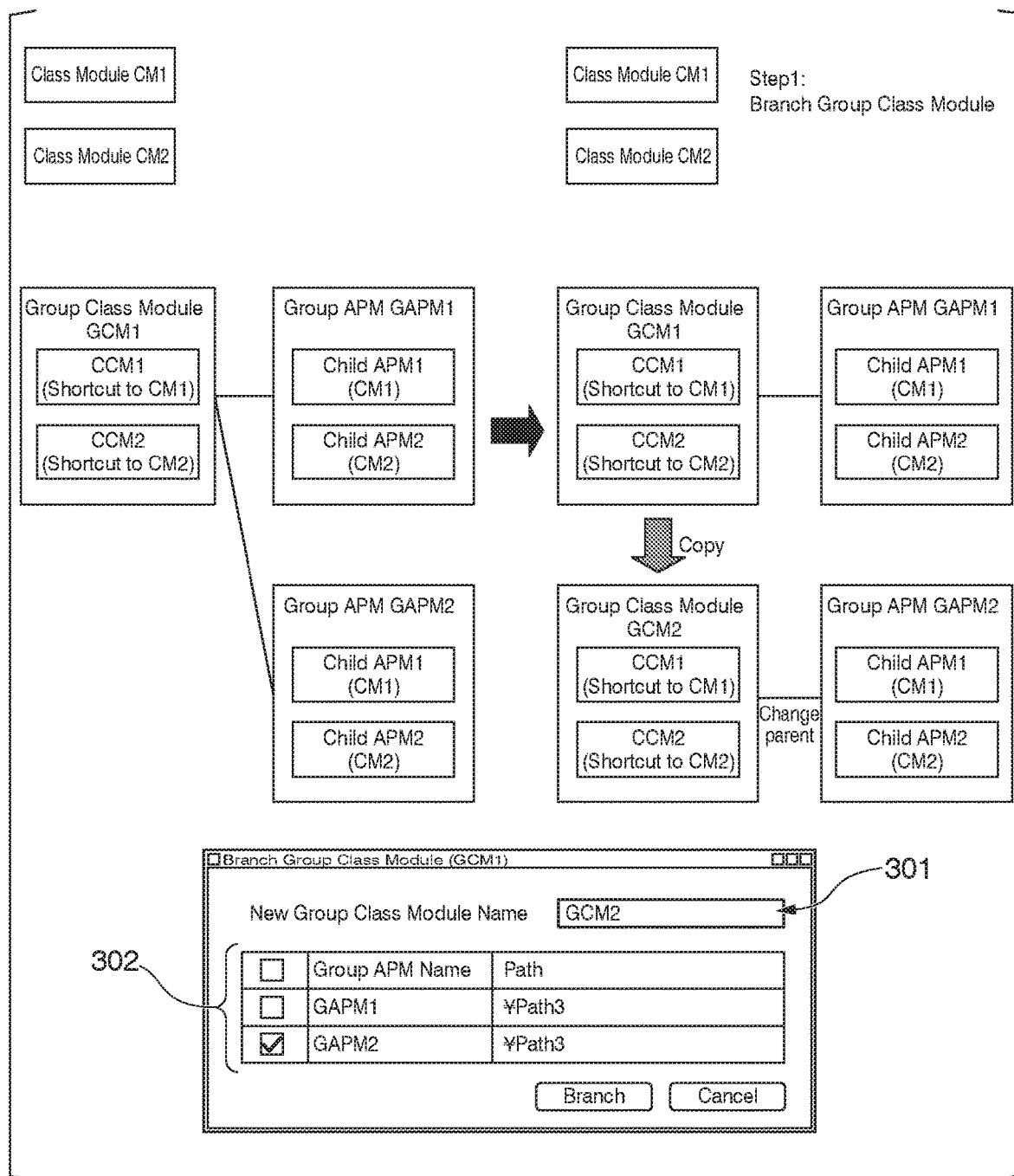
FIG. 4 is a schematic diagram illustrating the process for branching the group class module.
Figure 5:
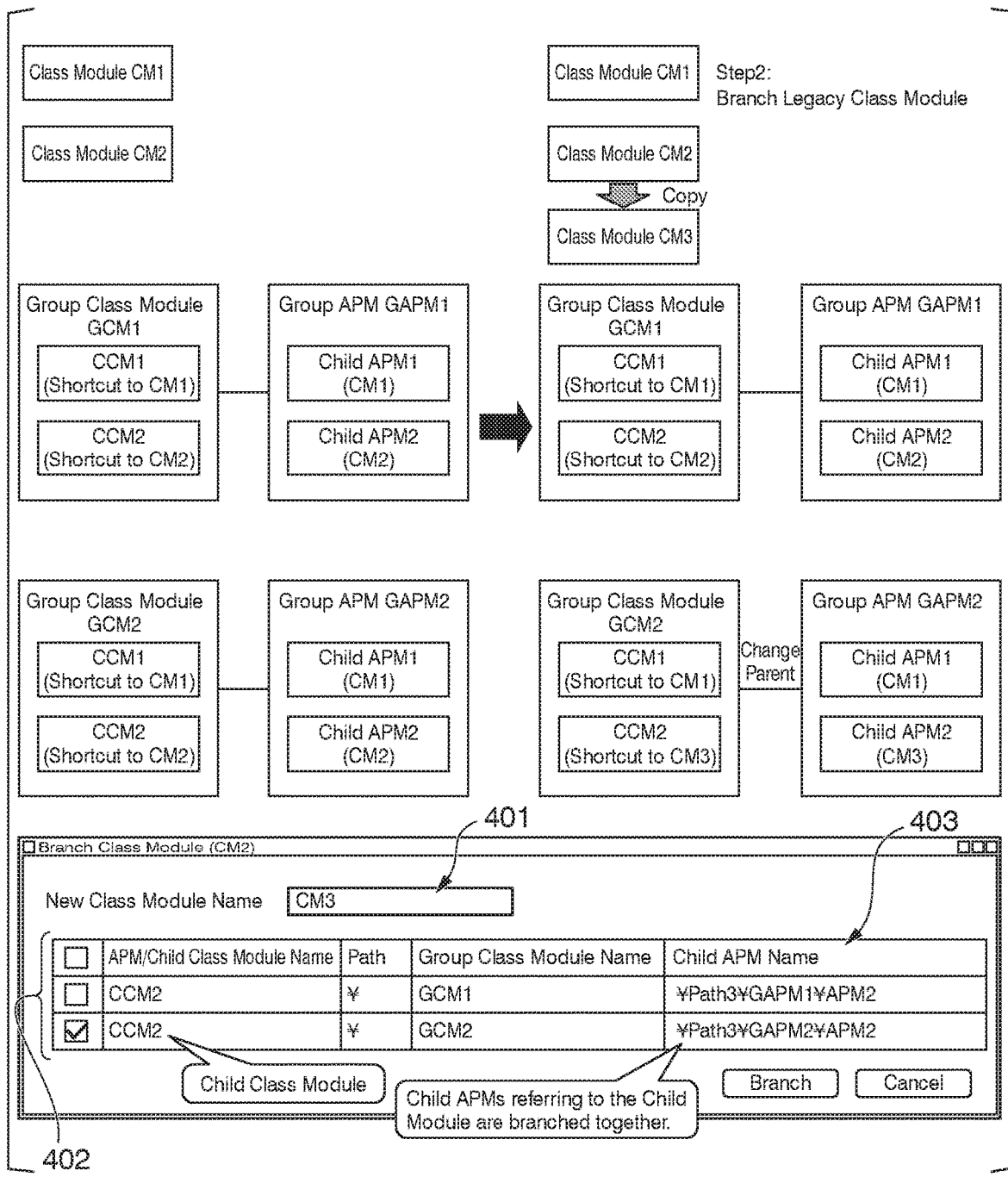
FIG. 5 is a schematic diagram illustrating the process for branching the legacy class module, after the process for branching the group class module of FIG. 4.

The following illustrative examples for branching processes will be described with reference to FIGS. 4 and 5. FIG. 4 is a schematic diagram illustrating the process for branching the group class module. FIG. 5 is a schematic diagram illustrating the process for branching the legacy class module, after the process for branching the group class module of FIG. 4.

As shown in FIG. 4, a branch group class module dialog is launched for branching the group class module and a window "Brach Group Class Module (GCM1)" is shown in a display screen. Before launching the branch group class module dialog, users have prepared class modules (CM1, CM2) in a class module library navigator. Further, users have prepared a group class module (GCM1) in a group class module library navigator, wherein the group class module (GCM1) has child class modules (CCM1, CCM2) which have shortcuts to the class modules (CM1, CM2), respectively. Furthermore, users have instantiated the group class module (GCM1) to create two group application modules (GAPM1, GAPM2) as instances in an application structure navigator. Each of the group application modules (GAPM1, GAPM2) has two child application modules (APM1, APM2) which are linked to the class modules (CM1, CM2), respectively. Namely, the child application modules (APM1, APM2) are linked to the class modules (CM1, CM2), respectively.

In the first step of the branch group class module dialog, users input a branch group class module name for anew group class module, which will be created by duplicating a source group class module (GCM1), in a text box "New Group Class Module Name" (301) in a window on a display screen. In this example, the branch group class module name is "GCM2" which means the group class module 2. This textbox is used to input the name for the branch group class module, or the name of the created duplicated group class module used for branching, wherein default value: empty.

In this state, the process for branching the group class module (GCM1) will be performed to create a new, duplicated group class module (GCM2) which is a duplication of the group class module (GCM1). The new, duplicated group class module (GCM2) has the child class modules (CCM1, CCM2) which have shortcuts to the class modules (CM1, CM2), respectively. The child class modules (CCM1, CCM2) of the new, duplicated group class module (GCM2) are the same as the child class modules (CCM1, CCM2) of the group class module (GCM1).

In the second step of the branch group class module dialog, all the linked group application modules (group APMs), for example, (GAPM1, GAPM2) of the selected group class module are shown as rows in a grid control (302). The grid control (302) includes information of the linked group application modules (group APMs). The grid control (302) allows users to select which linked group application module (group APM) to be included in the branching process, wherein users can use the checkbox column header to select and unselect a row in the grid control (302).

Based upon users selection of which linked group application module (group APM) to be included in the branching process, the selected group application module (GAPM2) will be automatically linked to the new duplicated group class module (GCM2), which is no longer linked to the group class module (GCM1). "Path" the path/location of the group application module (GAPM) can be referred in the application structure navigator.

As shown in FIG. 5, a branch legacy class module dialog is launched for branching the legacy class module and a window "Brach Legacy Group Class Module (CM3)" is shown in a display screen.

In the first step of the branch legacy class module dialog, users input a branch legacy class module name for a new class module, which will be created by duplicating a legacy class module (CM2), in a text box "New Class Module Name" (401) in a window on a display screen. In this example, the branch class module name is "CM3" which means the class module 3. This textbox is used to input the name for the branch class module, or the name of the created duplicated class module used for branching, wherein default value: empty.

In this state, the process for branching the class module (CM2) will be performed to create a new, duplicated class module (CM3) which is a duplication of the class module (CM2).

In the second step of the branch class module dialog, all the linked child class modules (CCM2 of GCM1, CCM2 of GCM2), and their referring child application modules of the child class module (CCM2), i.e. Child APM2 (CM2) of GAPM1 and Child APM2 (CM2) of GAPM2 are shown as rows in a grid control (402). The grid control (402) includes information of the class-based application modules (class-based APMs) and/or child class module (CCM2), and child application module, i.e. Child APMs (403) linked to the child class module. The child application module, i.e. Child APMs (403) are shown as supplementary information in a separate column.

The grid control (402) allows users to select which class-based application modules (class-based APMs) and/or child class modules and their referring child application modules (Child APMs) to be included in the branching process, to be specific, this could be completed by selecting a checkbox to select/unselect a row in the grid control (402).

Based upon users selection of which child class module (e.g. CCM2 of GCM2) and its child application module (Child APM2) together to be included in the branching process, the child class module (e.g. CCM2 of GCM2) and its child application module (Child APM2) will be automatically linked together to the new duplicated class module (CM3), which are no longer linked to the class module (CM2). "Path" the path/location of the child application module (Child APM) can be referred in the application structure navigator. In other words, the selected child class module and its referring or corresponding child application modules APMs will be configured for branching simultaneously.

The above-described branching processers can be applied not only to the group class module, but also to the class module.

Figure 6:
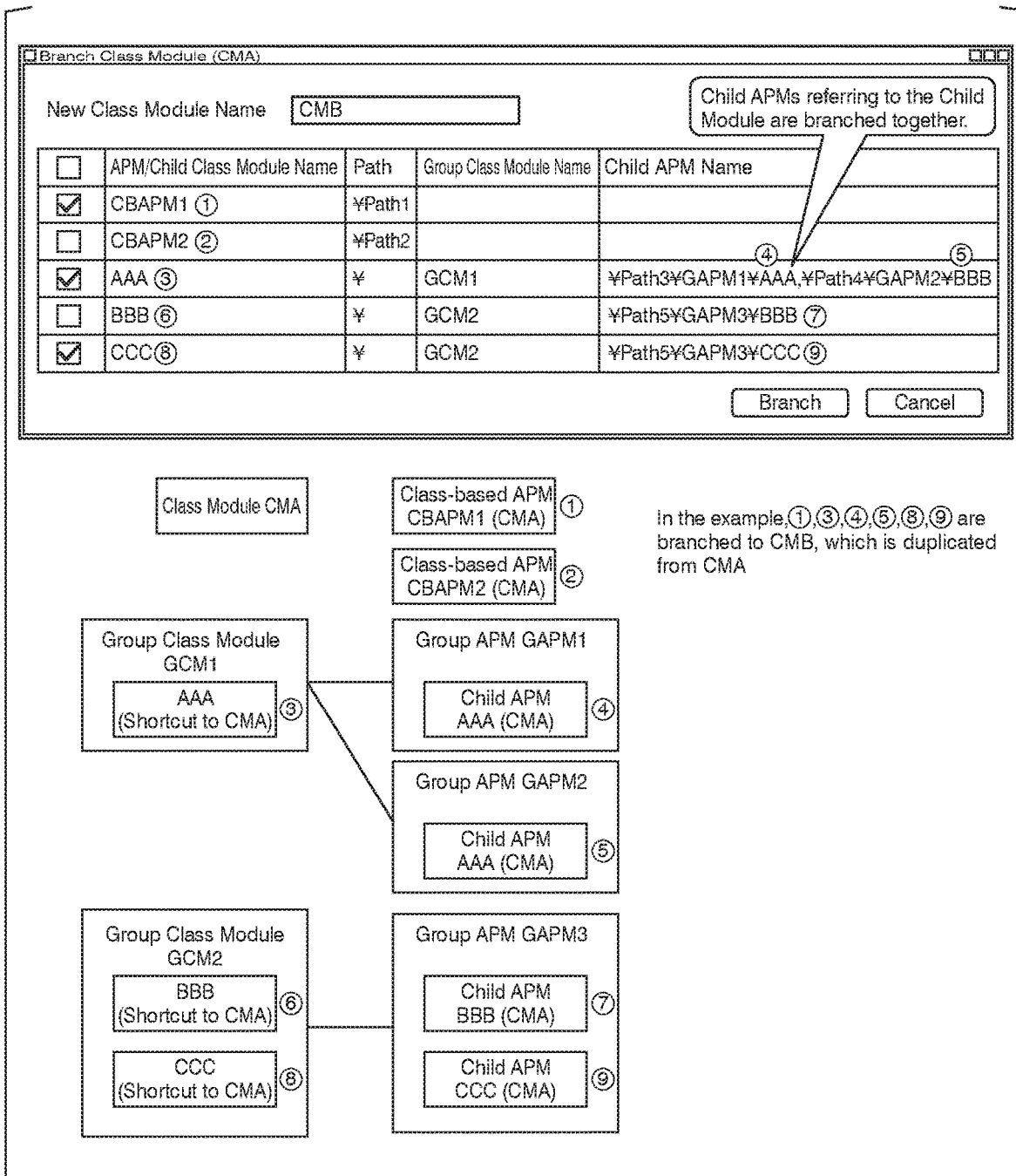
FIG. 6 is a schematic diagram illustrating the process for branching the class module.

FIG. 6 is a schematic diagram illustrating the process for branching the class module. As shown in FIG. 6, a branch class module dialog is launched for branching the class module and a window "Brach Class Module" is shown in a display screen. Before launching the branch class module dialog, users have prepared a class module (CMA) in a class module library navigator. Further, users have prepared a group class module (GCM1) in a group class module library navigator, wherein the group class module (GCM1) has a child class module (AAA) which has a shortcut to the class module (CMA). Furthermore, users have instantiated the class module (CMA) to create two class-based application modules (CBAPM1, CBAPM2) as instances in an application structure navigator. Also, users have instantiated the group class module (GCM1) to create two group application modules (GAPM1, GAPM2) as instances in the application structure navigator, wherein the group application module (GAPM1) has the child application module (child APM AAA) which has the shortcut to the class module (CMA) as well as the group application module (GAPM2) also has the child application module (child APM AAA) which has the shortcut to the class module (CMA). Also, users have duplicated the group class module (GCM1) to create a new, duplicated group class module (GCM2) in the group class module library navigator, wherein the new, duplicated group class module (GCM2) has two child class modules (BBB, CCC) which have shortcuts to the class module (CMA). Then, users have instantiated the new, duplicated group class module (GCM2) to create a group application module (GAPM3) as an instance in the application structure navigator, wherein the group application module (GAPM3) has the two child application modules (child APM BBB, child APM CCC) which have the shortcut to the class module (CMA).

In the first step of the branch class module dialog, users input a branch class module name for a new class module, which will be created by duplicating a source class module (CMA), in a text box "New Class Module Name" in a window on a display screen. In this example, the new class module name is "CMB". This textbox is used to input the name for the branch class module, or the name of the created duplicated class module used for branching, wherein default value: empty.

In this state, the process for branching the class module (CMA) will be performed to create a new, duplicated class module (CMB), which is not illustrated in FIG. 6, and which is a duplication of the class module (CMA).

In the second step of the branch group class module dialog, the class-based application modules (CBAPMs) for example, the class-based application module (CBAPM1), the class-based application module (CBAPM2), the child class modules, i.e. the child class module (AAA) of GCM1, the child class module (BBB) and the child class module (CCC) of GCM2, and the child application modules referring to the child class modules are shown as rows in a grid control. The grid control includes information of the linked class-based application modules (CBAPMs), child class modules of the group class modules (group CMs), and its referring child APMs. The grid control allows users to select which linked class-based application module (CBAPMs), child class modules of group class module (group CMs), and/or its referring child APMs to be included in the branching process, wherein users can use the checkbox column header to select and unselect a row in the grid control.

Based upon users selection of which linked class-based application module, child class modules of the group class modules (group CMs), and its referring child APMs to be included in the branching process, the selected class-based application module (i.e. (1) CBAPM1), the child class modules (i.e. (3) AAA, (8) CCC), and the child APMs of AAA, i.e. (4) Child APM AAA of GAPM1 and (5) Child APM AAA of GAPM2, and the child APM of CCC, i.e. (9) Child APM CCC of GAPM3 will be automatically linked to the new duplicated class module (CMB), which are no longer linked to the class module (CMA). "Path" the path/location of the class-based application module (CBAPM1) and the group application module (GAPM) can be referred in the application structure navigator.

The above described branching processes for branching the class module and/or the group class modules can be implemented in a group module-based engineering system in a plant engineering system. The above-descriptions have been forces on the branching processes for branching the engineering templates such as the group class module and the class module. The following descriptions will focus on other processes which are also performed for engineering processes in combination with the above-described branching processes. The other processes than the above-described branching processes may include instantiating process, updating process and binding process. As described above briefly, the above-described branching processes will reduce actual works for updating processes, and reusability of the original template.

[Module-Based Engineering Using Group Class Modules and Group Class Modules]

One of the most significant functions of the module branching process in the class module-based engineering for automation design of an industrial plant is improvement in reusability. Reuse of the already tested class module and/or group class modules can improve engineering quality and reduce engineering time and testing time wherein the already tested class module and/or group class modules are revised in part and reused in part.

Figure 7:
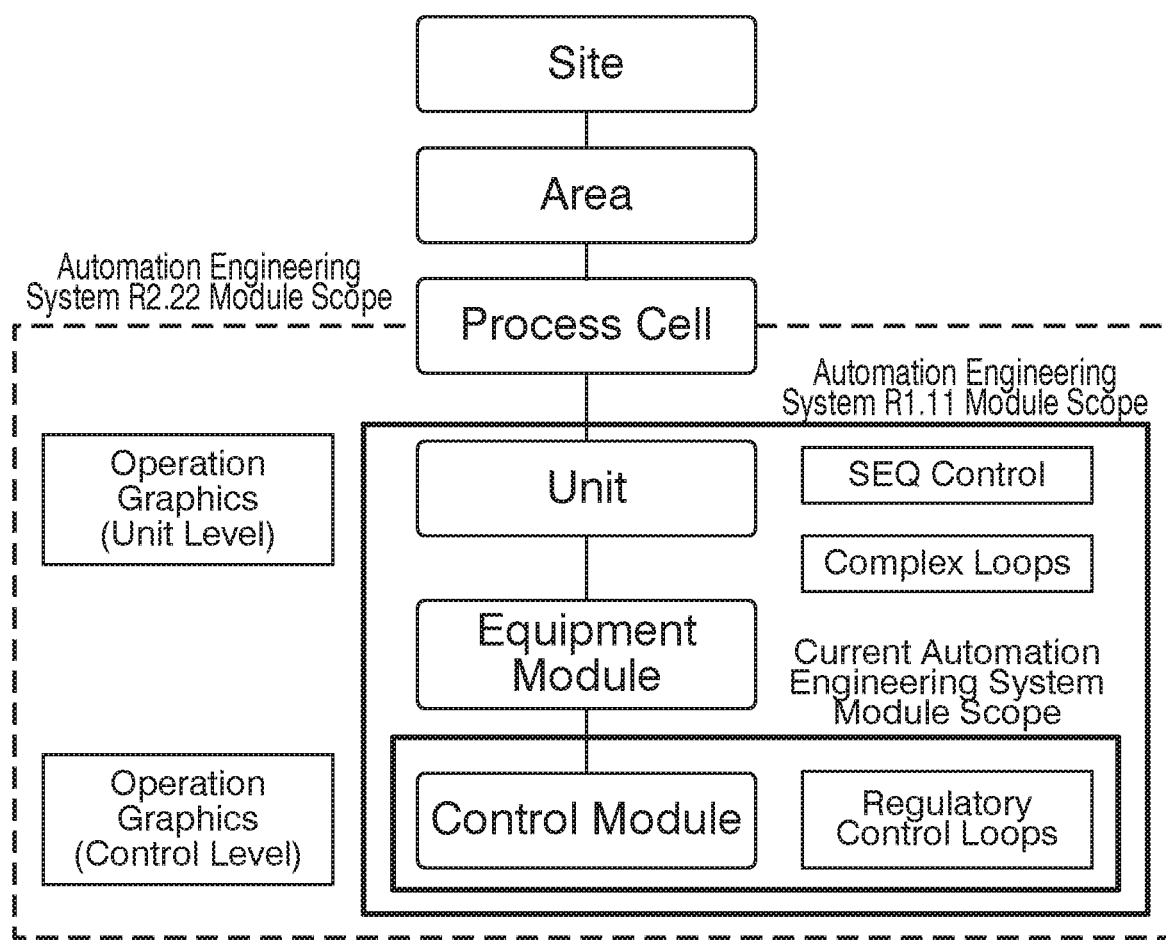
FIG. 7 is a block diagram illustrating a hierarchy of an industrial plant which refers to a variety of equipment in a plant control system that is organized into layered architectures based on group class module-based engineering.

The grouping of the class modules for drawings in terms of the characteristics and behaviour of a class-module-based object oriented to instantiate will expand the scope of the module-based engineering to complex loops of control module drawings, equipment module drawings and/or unit drawings. The value of the module-based engineering in terms of its reusability is greatly increased. The control module drawings with the ccomplex loops can be exported and imported. The control module drawings with the ccomplex loops can be instantiated and assigned to physical devices such as field control systems. FIG. 7 is a block diagram illustrating a hierarchy of an industrial plant which refers to a variety of equipment in a plant control system that is organized into layered architectures based on group class module-based engineering. For group module-based engineering, group class modules are reusable not only at the control module level or the lowest level but also at higher levels such as the equipment module level and the unit module level. The scope of group class module engineering by using the group class modules covers not only the lowest level or the control module level but also the equipment module level and the unit level. The group class module has a range of more than one drawing. In an industrial usage, a typical loop may have multiple drawings of control modules, equipment modules and/or unit. The scope of module engineering by using the group class modules covers a complex loop of multiple drawings of control modules, equipment modules and/or unit.

The group class module may flexibly be instantiated as a whole or partially which allows users to create not only a highly complex structure of drawings but also being flexible to instantiate a simpler structure of control module drawings. The instantiation of the group class module may be either top-down or bottom-up approach or simply extraction from any complex structure of control module drawings, equipment module drawings and/or unit drawings. The top-down approach may be, for example, but not limited to, module developments in the order of unit, equipment module, and control module. The bottom-up approach may be, for example, but not limited to, module developments in the order of control module, equipment module, and unit.

The group class module may be designed to adhere to some of characteristics and behaviour of a class-based object-oriented-like which is able to instantiate. Each group class module may contain one or more child class modules which are shortcuts or references to a class module in the same way that a class may contain or refer to another class as its property and/or field. The group class module is not applicable to all the characteristics of a class in object-oriented such as class inheritance. This means that it is not possible to inherit or basing the class module from another class module or group class module, polymorphism, etc.

Figure 8:
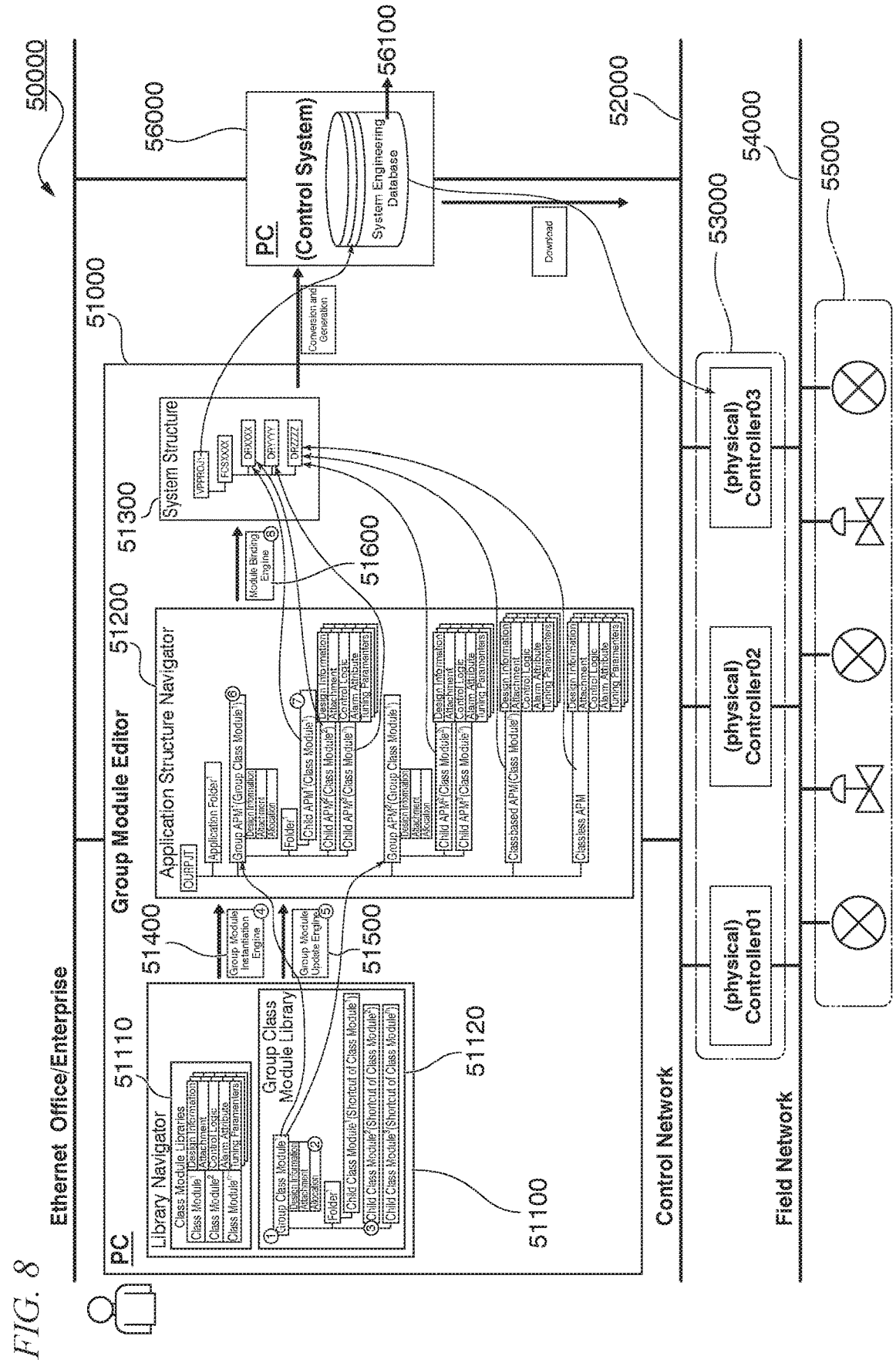
FIG. 8 is a block diagram illustrative of a plant engineering system which includes a group module-based engineering system which uses group class modules reusable at the control module level, equipment module level and/or unit level.

FIG. 8 is a block diagram illustrative of a plant engineering system which includes a group module-based engineering system which uses group class modules reusable at the control module level, equipment module level and/or unit level. The plant engineering system 50000 includes a group module engineering system 51000, a control network 52000, a plurality of physical field controllers 53000, a field network 54000, a plurality of field devices 55000, and a control system 56000. The control system 56000 has a system engineering database 56100. The control system 56000 is connected via any available network such as Ethernet to the group module engineering system 51000. The control system 56000 is connected via the control network 52000 to the plurality of physical field controllers 53000. The plurality of field devices 55000 is connected to the field network 54000 which is further connected to the plurality of physical field controllers 53000, so that the plurality of physical field controllers 53000 control the plurality of field devices 55000.

The group module engineering system 50000 includes a group module engineering editor 51000. The group module engineering editor 51000 includes a library navigator 51100, an application structure navigator 51200, a system structure 51300, a group module instantiation engine 51400, a group module update engine 51500, and a group module binding engine 51600. The library navigator 51100 have two different types of navigational libraries, for example, class module libraries 51110 and group class module libraries 51120. The class module libraries 51110 include reusable class modules as class-based engineering templates. Each class module includes design information, attachments, control logics, alarm attributes and turning parameters. The group class module libraries 51120 include reusable group class modules as group class-based engineering templates.

The hierarchy of the application structure navigator should be reflected to plant hierarchy of control system to allow for the expansion of the scopes of the module engineering.

The class module library 51110 contains definition of class module which contains the re-usable module engineering data (control logic, alarm parameters, and tuning parameter) and documentation (design information and attachment). Each class module is composed of 1) description information, 2) attachment, 3) control logic, 4) alarm attribute and 5) tuning parameters.

The group class module library 51120 contains definition of group class module which contains the groupings of class modules to form more complex loops which are bound to multiple control drawings.

Design information is used in document generation function where the design of the module may be published to a word document.

Attachment is used to store relevant artifacts related to the class module. Artifacts can be any binary files.

A control logic contains the logic information of process control. The contents of the control logic are to engineer the control drawing and function block detail definition.

The contents of alarm attributes are to engineer the alarm attributes of function block and the alarm attributes handled in an alarm system for operation stations (HIS).

The contents of tuning parameters are to engineer design values of control-related tuning parameters.

Each group class module composed of 1) design information, 2) attachment, and 3) allocation. Design information and attachments are similar function as in a class module, which are intended for documentations while the allocation defines the groupings of class modules and their assignments to multiple control drawings in order to define the complex loops.

Child class modules include shortcuts to class modules. Child class modules define and form the logic of complex loops in a group module.

Group class module can define its own topology to represent logical structure for a control and/or equipment module or unit.

(Group Module Libraries)

Each group class module has a complex structure. Each group class module includes design information, attachment and allocation. Each group class module may have one or more class folders. A class folder can be created under a group class module or another class folder in a group class module so that the class folder may include o one or more child class modules or one or more other class folders. Each group class module may also have one or more child class modules. FIG. 8 illustrates one example of the complex structure of the group class module. Herein, a class folder such as a folder 1 belongs to the group class module 1. The group class module 1 includes a plurality of child class modules 1, 2, - - - n which are associated to a plurality of class modules 1, 2, - - - n, respectively. In this example, the child class module 1 belongs to the class folder 1. The other remaining child class modules 2, 3, - - - n belong commonly to the group class module 1. One of the differences of the group class module from the normal class module is that the group class module includes the allocation and a plurality of child class modules which are associated to a plurality of class modules, respectively. The allocation for the group class module and the plurality of child class modules will expand the scope and allow that the scope of the group class module-based engineering covers not only the regulatory simple loop of control module drawings at the lowest hierarchy level but also the complex loop of drawings at higher hierarchy levels, for instance, equipment level and unit level.

First, user creates group class modules in the group class module libraries 51120. Then, user creates class folders and 'child class modules under the group class module. Child class modules are shortcut files to the legacy class modules.

The allocation in the group class module as the engineering template includes module grouping information for control module drawings. The allocation defines at least two: 1) groupings of class modules and 2) assignments of the class modules to multiple drawings of control modules, equipment modules and/or unit to define a complex loop structure of multiple logical drawings. There is another type of allocation for group application module, which will be described later. Described here is the allocation in the group class module as the engineering template for the complex loop structure of multiple logical drawings.

A respective plurality of child class modules belongs to an associated group class module of the plurality of group class modules. Each child class module includes a respective shortcut file which refers to an associated class module of the plurality of class modules. The respective plurality of child class modules, which belong to the associated group class module, define and form logic of the complex loops in the associated group class module.

The child class module belonging to the group class module as the engineering template includes a respective shortcut file which refers to a class module of the plurality of class modules in the class module libraries 51110. The class module to which the child class module refers is a legacy class module for the child class module. The group class module as the engineering template allows users to select instantiation or non-instantiation of each child class module. In other words, the group class module as the engineering template allows users to select one or more child class modules to be not instantiated, and the remaining child class module or modules to be instantiated. Modification to the legacy class module will reflect directly to all of one or more child class modules which refer to, and which is instantiated from, the legacy class module. This will leads to a certain enhancement of module maintainability. The legacy class module to which one or more child class modules refer are exportable and importable. The group class module is checked-out/in per entire group class module. Each child class module cannot be checked out/checked in independently. Each child class module can be deleted from the legacy class module. An additional child class module can be added to the legacy class module wherein the additional child class module has a shortcut file which refers to the legacy class module. The shortcut file of each child class module can refer to the legacy class module in the same way that a class can contain or refer to another class as its property and/or field. For the group class module-based engineering, the child class modules are necessary because a plurality of child class modules referring to the legacy class module define and form the logic of complex loops of a group class module.

The group class module can define its own topology to represent logical structure for control module drawings, equipment module drawings and/or unit drawings.

The design information, such as functional specifications, may be defined as a module component. The design information may generally include texts, images, and tables that explain the details of the module. The control logic may include a control drawing and detailed definitions of functional blocks, switches, and messages. The control logic may be defined in a class module or an application module. Module-based engineering may allow tuning parameters to be treated as module components by bulk editing of tuning parameter design values in functional blocks defined in control logic of a field control system, and by comparing and setting tuning parameter design values and current values of a field control system. The alarm attributes may be alarm setting values and alarm priorities. An arbitrary file can be attached as a module component. The list of attachments can be launched by a simple operation.

(Instantiation of Group Class Module)

As shown in FIG. 8, the module engineering editor 51000 includes the group module instantiation engine 51400. The group module instantiation engine 51400 creates the group application module (group APM) on the basis of user configuration of selected child class modules. It is possible that some of the child class modules are excluded from the derived group application module (group APM). This allows engineer or user to construct the module engineering data for a group module by phases.

The group module instantiation engine 51400 is configured to instantiate the group class module 1 and the child class modules 1, 2, - - - n in the group class module libraries 51120 to generate instances and child instances which belong to the instances, in the application structure navigator 51200. The instances created or instantiated by the group module instantiation engine 51400 from the group class module 1 include group application modules 1 and 2 (group APM 1, group APM 2) as the instances and an application folder 1. The application folder 1 belongs to the group application module 1 (group APM 1). Herein, as a result of partial instantiation, the group application module 2 (group APM2) is able to not including an application folder 1, as a class folder 1, which includes the child class module 1 in the group class module library 51120 has not been instantiated.

The group application modules 1 and 2 (group APM 1, group APM 2) belong to a certain project (PJT). The child instances created or instantiated by the group module instantiation engine 51400 from the child class modules 1, 2, - - - n in the group class module libraries 51120 include a first set of child application modules 1, 2, - - - n as well as a second set of child application modules 2, - - - n. The first set of child application modules 1, 2, - - - n belongs to the group application module 1 (group APM 1), wherein the child application module 1 belongs to the application folder 1 which belongs to the group application module 1 (group APM 1). The other child application modules 2, - - - n belongs directly to the group application module 1 (group APM 1). The first set of child application modules 1, 2, - - - n are associated with the class modules 1, 2, - - - n, respectively. The second set of child application modules 2, - - - n belongs directly to the group application module 2 (group APM 2). The second set of child application modules 2, - - - n are associated with the class modules 2, - - - n, respectively.

Each of the group application modules 1 and 2 (group APM 1, group APM 2) includes the design information, the attachment and the allocation. The allocation of the group application module 1 (group APM 1) may be just a subset from the allocation of the group class module. The allocation in each of the group application modules 1 and 2 (group APM 1, group APM 2) may include module grouping information for control module drawings, equipment module drawings and/or unit drawings. The allocation in each of the group application modules 1 and 2 (group APM 1, group APM 2) defines at least two: 1) groupings of group application modules 1 and 2 and assignments of the group application modules 1 and 2 to multiple drawings of control modules, equipment modules and/or unit to define a complex loop structure of multiple logical drawings.

Further, the group module instantiation engine 51400 is configured to instantiate the class modules 1, 2, - - - n in the class module libraries 51110 to generate class-based application modules 1, 2, - - - n which are associated with the class modules 1, 2, - - - n, respectively. After generating the class-based application module, the class-based application module can be updated by group module update engine 51500 so that the association between the class-based application module and the class module is broken and the class-based application module is made independent from the class module, resulting in that the class-based application module becomes a classless application module.

As shown in FIG. 8, each of the child application modules 1, 2, - - - n, the class-based application module n, and the classless application module includes design information; control logic; tuning parameters; alarm attributes; and attachments. Design information, such as functional specifications, may be defined as a module component. The design information may generally include texts, images, and tables that explain the details of the module. Control logic may include a control drawing and detailed definitions of functional blocks, switches, and messages. The control logic may be defined in a class module or an application module. Module-based engineering may allow tuning parameters can be treated as module components by bulk editing of tuning parameter design values in functional blocks defined in control logic of a field control system, and by comparing and setting tuning parameter design values and current values of a field control system. Alarm attributes may be alarm setting values and alarm priorities. An arbitrary file can be attached as a module component. The list of attachments can be launched by a simple operation.

The module engineering editor 51000 further includes a group module update engine 51500. The group module update engine 51500 is configured to update the group application modules 1 and 2 (group APM 1, group APM 2), and class-based application modules (class-based APMs). The module engineering editor 51000 includes a module binding engine 51600. The module binding engine 51600 is configured to bind child application modules 1 and 2 (child APM 1, child APM 2), which belong to the group application module 1 (group APM 1) to control drawing "DRXXX", and also bind another instance, a child application module (child APM 3) to another control drawing "DRYYYY". Similarly, the module binding engine 51600 is configured to bind a class-based application module (class-based APM) and a classless application module (classless APM) both to a still another control drawing "DRZZZZ". The control drawing "DRXXX", "DRYYYY", and "DRZZZZ" in the system structure 51300 are converted into engineering data and the engineering data is stored in the system engineering database 56100. As shown in FIG. 5, the application modules instantiated from group class modules and class modules are bounded by the module binding engine 51600 to multiple control drawings and to define complex loops of control module drawings, equipment module drawings and/or unit drawings. As a result of expanding the engineering scope to equipment module and/or unit level, the engineering efficiency for industrial controls has been significantly improved.

As described above, the hierarchy of the group class module and the child class modules in the group class module libraries 51120 will be reflected to the application structure navigator 51200 during the instantiation of the group class module and the child class modules in the group class module libraries 51120 by the group module instantiation engine 51400. User configures grouping of class modules in the module libraries 51110 to generate group class modules in the group class module libraries 51120. The reason why user configures grouping of class modules is that this grouping is to be used in later process, module binding after instantiation. After user configured grouping of class modules and generated the group class modules in the group class module libraries 51120, user performs the instantiation so that group application modules (group APMs) and their hierarchy will be created at a location which the user specifies in the application structure navigator 51200. The instance that is instantiated from the group class module is called to as group application module (group APM). The instance that is instantiated from the child class module is called to as child application module (child APM). When performing the instantiation, user can select one or more child class modules which are not to be instantiated or, in other words, select child class modules to be instantiated. User can instantiate the same group class module with different selections to one or more child application modules (child APMs). This partial instantiation may, for example, generate a first group application module with a first set of one or more child application modules (child APMs) and a second group application module with a second set of one or more child application modules (child APMs), wherein the first set of one or more child application modules (child APMs) are different from the second set of one or more child application modules (child APMs). The group module instantiation engine 51400 is configured to create group application modules (group APMs) on the basis of user configuration of selected child class modules. It is possible that some of the child class modules are excluded from the derived group application modules (group APMs). This allows engineer or user to construct the module engineering data for a group module by phases. The module engineering editor 51000 contains implementations to create applicable instance of group class modules to allow users to reuse the template group class module.

The design information is not copied or inherited by the group application module (group APM). The design information may have its own documentation to explain its real-world or concrete usage, design, and purpose. The attachment is not copied or inherited by the group application module (group APM). The attachment may have its own documentation to explain its real-world or concrete usage, design, and purpose. The allocation of group application module (group APM) may be just a subset from the allocation of group class module, depending on which child class module is instantiated.

User selects which child class modules to include in instantiation of group class module.

Respective child application modules (child APMs) 1, 2 and 3 usually have 1) design information, 2) attachment, 3) control logic, 4) alarm attribute and 5) tuning parameters.

There is a difference between the design information in the child application module 1 (child APM1) in the application structure navigator 51200 and design information in class module 1 in class module libraries 51110.

There is a difference between the attachment in the child application module 1 (child APM1) in the application structure navigator 51200 and attachment in class module 1 in class module libraries 51110.

In some editable fields, there is a difference between the control logic in the child application module 1 (child APM1) in the application structure navigator 51200 and control logic in class module 1 in class module libraries 51110.

In some editable fields, there is a difference between the alarm attributes in the child application module 1 (child APM1) in the application structure navigator 51200 and alarm attributes in class module 1 in class module libraries 51110.

In some editable fields, there is a difference between the tuning parameters in the child application module 1 (child APM1) in the application structure navigator 51200 and tuning parameters in class module 1 in class module libraries 51110.

The group application module 1 (group APM1) and group application module 2 (group APM2) are created from the group class module 1 in order to reuse the module engineering data in terms of topology, and contents by simply instantiating from a source Group Class Module and further in order to minimize engineering effort. Some editable parameters will still have to be configured. Class-based application module (Class-based APM) has a source class module and a classless application module (classless APM) does not refer to any source class module.

Figure 9:
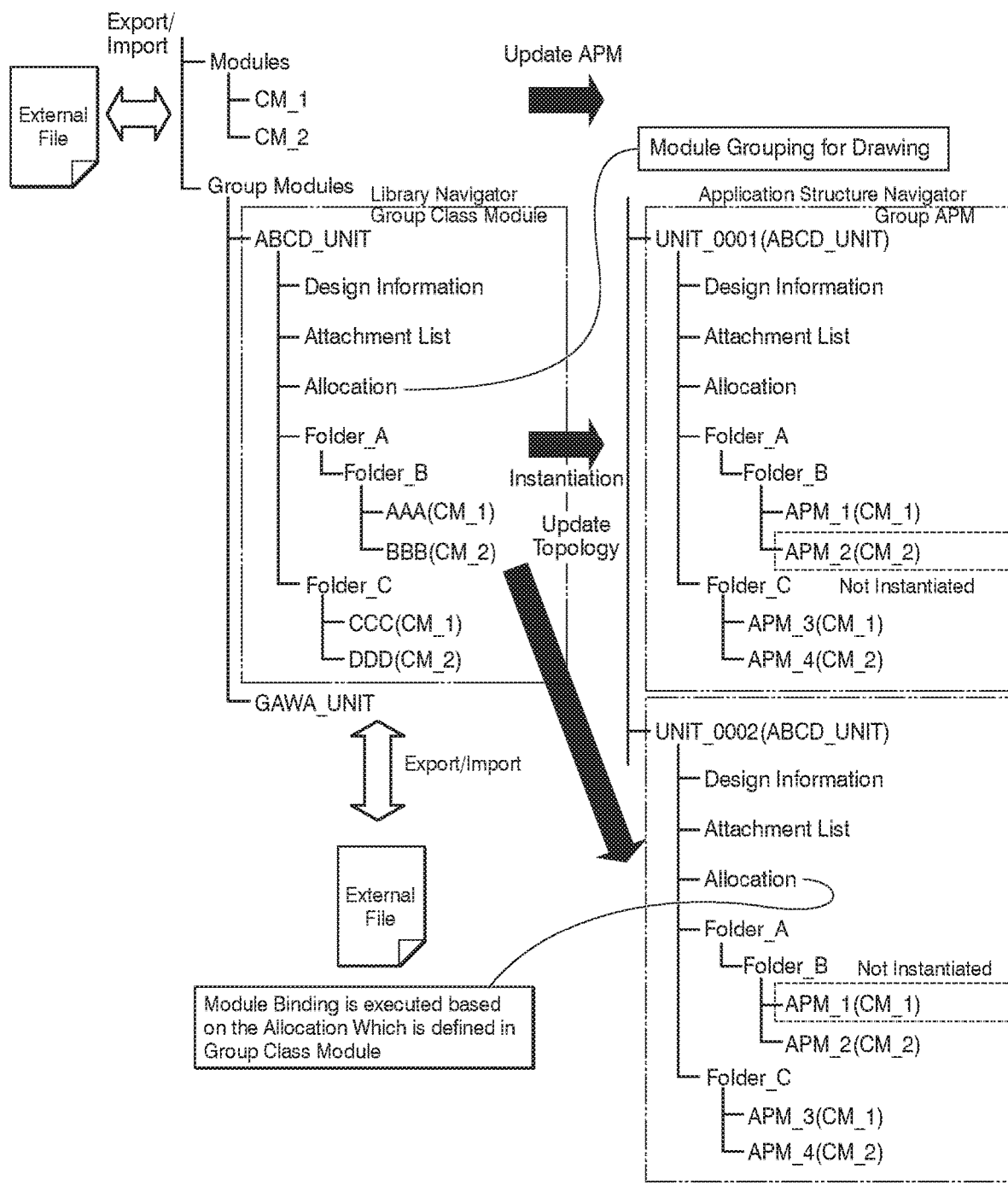
FIG. 9 shows an example of a group class module and two group application modules that have been partially instantiated from the group class module.

FIG. 9 shows an example of a group class module and two group application modules that have been partially instantiated from the group class module. Allocation defines the groupings of class modules and their assignments to multiple control drawings in order to define the complex loops. As way of example, group class module "ABCD_UNIT" in the library has been instantiated as group APM "UNIT_0001 (ABCD_UNIT)" or group APM "UNIT_0002 (ABCD_UNIT)". Users could select a child class module under a group class module not to be instantiated according to design needs and/or design phases for performing partial instantiation. For instance, as shown in FIG. 6, child class module "BBB (CM_2)" of group class module "ABCD_UNIT" has not been instantiated in group APM "UNIT_0001 (ABCD_UNIT)".

Finally, the logical control drawings, which were configured in the group class module, will be assigned to control drawings of physical field control systems 33000. In some cases, group application modules (group APMs) under the same group class module should be assigned to the same physical field control system 33000. When a legacy class module is referred from multiple child class modules, modifications for the legacy class module are reflected directly to multiple child class modules, which leads to enhanced module-maintainability.

(Binding Group Application Modules for Control Drawings)

As shown in FIG. 8, the module engineering editor 51000 includes the module binding engine 51600. The module binding engine 51600 is configured to bind child application modules 1 and 2 (child APM 1, child APM 2), which belong to the group application module 1 (group APM 1) to control drawing "DRXXXX", and also bind another instance, a child application module (child APM 3) to another control drawing "DRYYYY". Similarly, the module binding engine 51600 is configured to bind a child APM, i.e. child APM 2 of Group APM 2, class-based application module (class-based APM) and a classless application module (classless APM) both to a still another control drawing "DRZZZZ". The function of the module binding engine 51600 is to maintain relationships among the child application modules (child APMs). Legacy application modules (legacy APMs) can be independently bound to any drawing and there are no groupings or restrictions applied to the legacy application modules (legacy APMs). In the group application modules (group APM) Group APM the allocation information will pre-assign groupings to the child application modules (child APMs) to enforce he child application modules (child APMs) to be assigned to the same control drawings.

(Update of Group Class Module after Instantiation)

The group module update engine 51500 is used to synchronize the changes of topology and allocation data from group class module to its applicable instance of the group application module (group APM). The group module update engine 51500 is configured to update topologies in loop structure of the group application modules 1 and 2 and topologies of one or more target group application modules 1 and/or 2 for synchronizing or reflecting the update of the topologies of the group application modules 1 and 2 to the topologies of the one or more target group application modules 1 and/or 2. The group module update engine 51500 is configured to update the allocation of each group class module and a respective topology of the complex loops of each group class module 1 in the group class module libraries 51120. The group module update engine 51500 is configured to update an allocation of a target group application module 1 or 2 (target group APM 1 or group APM 2) and a respective topology of the complex loops of the target group application module 1 or 2 (target group APM 1 or group APM 2). The group module update engine 51500 is configured to identify, or to allow user to identify, which group application module and its topology in loop structure must be reflected to a target group application module (target group APM). In other words, the group module update engine 51500 is used to reflect the change or modification by update of the topology in loop structure of the group class module to the topology in loop structure of the target group application module (target group APM).

As described above, each group class module has a complex loop structure. Complex update managements are necessary for the group class modules. As described above, each group class module has design information, attachment list and allocation. As also described above, each group application module (group APM) has design information, attachment list, and allocation. The design information and the attachments are separate definitions, and are not updated during instantiation or module update. The term "update" refers a process for change, modification, addition and deletion. The process for reflecting the change or modification by update of the topology in loop structure of the group class module to the topology in loop structure of the target group application module (target group APM) may include three steps: 1) updating the topology in loop structure of the target group application module (target group APM), 2) adding or deleting one or more child application modules to or from the target group application module (target group APM) to which the one or more child application modules belong; and 3) contents of the one or more child application modules.

The group module update engine 51500 is configured to perform the update between topologies of the group class module and group application module (group APM) on the basis of the existence of child application module (child APM) in the group application module (group APM) and the changes to the location of the source child class modules. The group module update engine 51500 contains implementations to update the previously created applicable instance of group class modules with its newer versions.

More detailed descriptions for update of group class module after instantiation will be described in terms of reusability, check-out/in, contents, update, and ungroup.

Figure 10:
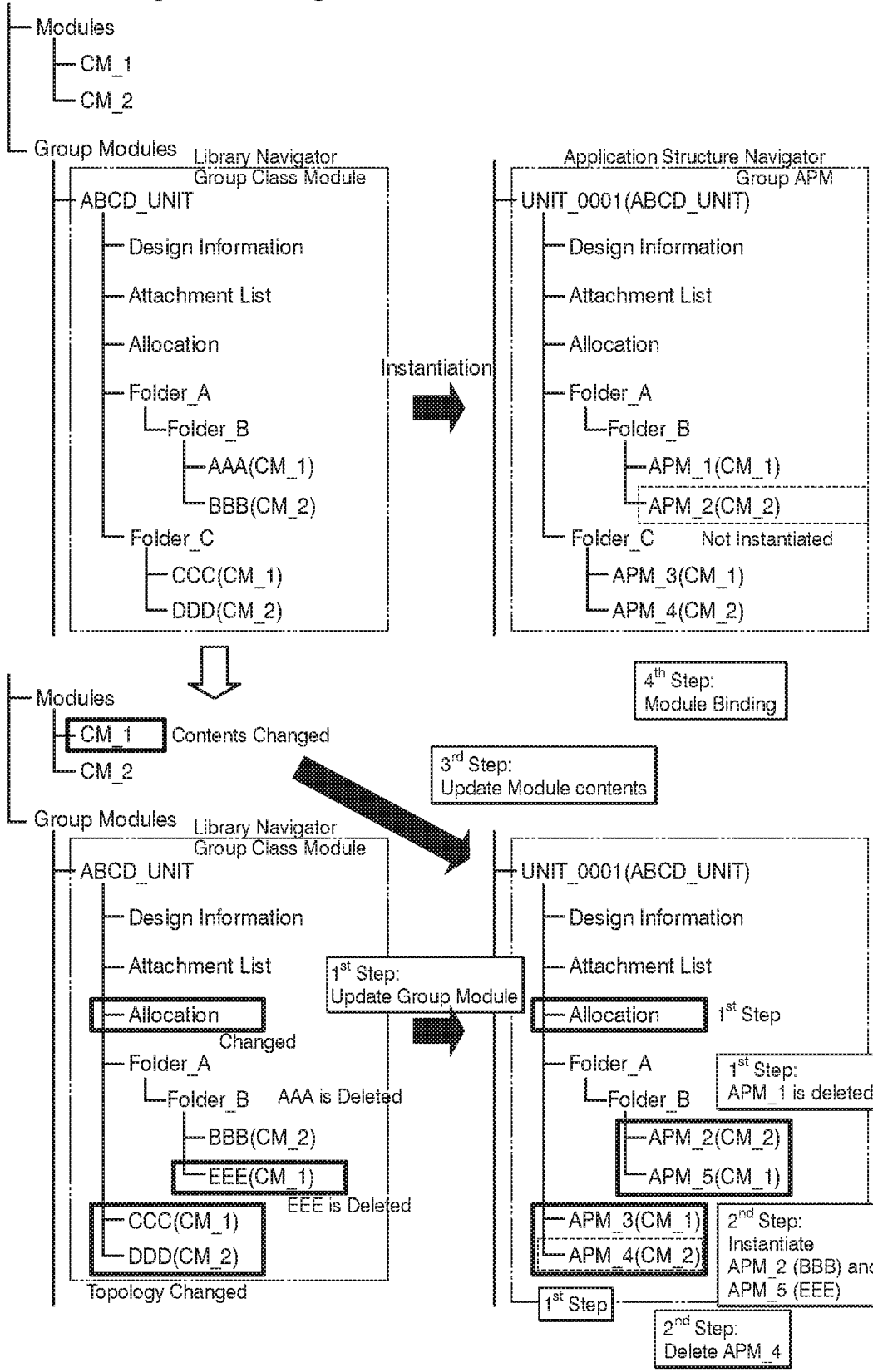
FIG. 10 shows an example of update management for group class modules and group application modules.

FIG. 10 shows an example of update management for group class modules and group application modules. After instantiation if Class Module "AAA" is deleted under Group Class Module, then its instance APM_1 will be deleted from corresponding Group APM under the Application Structure, when module update has been triggered and/or performed. If Class Module EEE (CM_1) is added under Group Module, it will be instantiated using a separate Instance Window Dialogue and being instantiated as APM_5 (CM_1). Engineer or user could delete class APM under the application structure, for example, deleting APM 4, but its source class module will not be deleted by this deletion (DDD (CM_2).

Reusability:

The group class module can be exported and/or imported in two steps. Firstly, legacy class modules referred by child class modules are exported and/or imported. Secondary, group class module is exported and/or imported. Re-usable module engineering data can be exported and imported to the engineering database of other system projects, so that other system project could re-use the engineering data.

Check-Out and/or Check-In

The processes for check-out and/or check-in can be performed per entire group class module including all child class module or modules which belong to the group class module. Namely, each child class module cannot be checked-out and/or checked-in independently. In contrast, as for group application module (group APM), the processes for check-out and/or check-in can be performed per group application module (group APM) alone or in combination with child application modules (child APMs). Namely, each child application module (child APM) can be checked-out and/or checked-in independently.

Contents

As described above, the group class module has design information, attachment list and allocation for the group class module. As also described above, the group application module (group APM) has design information, attachment and allocation. The design information and attachment are separate definitions, and are not updated during instantiation or module update processes. This behavior is same as that of legacy modules.

Update

As described above, if the group class module is modified after instantiation, the modification can be reflected to group application module (group APM) in the following three steps.

1) Update Group APM topologies.
2) Add and/or Delete Child APMs.
3) Update Child APM Contents.

Firstly, a module update manager is launched for the group class module. Then, the topologies and the allocation of the group application module (group APM) are updated by the module update manager. The group application module (group APM) is updated through user's selection and/or by user to trigger, if the group class module is modified). In case that a child class module is deleted by updating the group class module, the corresponding child application module (child APM) is deleted. In this stage, all child application modules (child APMs) must be checked-out and/or checked-in.

Secondary, in case that one or more child class modules are added, the added child class modules are instantiated in an instance list window. If it is necessary to delete one or more child application modules (child APMs), the one or more child application modules (child APMs) are deleted in the application structure navigator.

Finally, legacy class modules referred by child class modules are updated, so that the contents of child application modules (child APMs) are updated.

Ungrouping Group APMs

A user can perform "Ungroup" of group application modules (group APMs). Ungroup refers to an opposite process to the process for grouping. Ungrouping the group application modules (group APMs) will break any loop structures and place each application module directly under a top folder as a project folder in the application structure. After the process for "ungroup", the top folder of the group application modules (group APMs) will become application folders, wherein design information and attachment list directly under the top folder are deleted and child application modules (child APMs) will become class-based application modules (class-based APMs) which refer to respective class modules.

Figure 11:
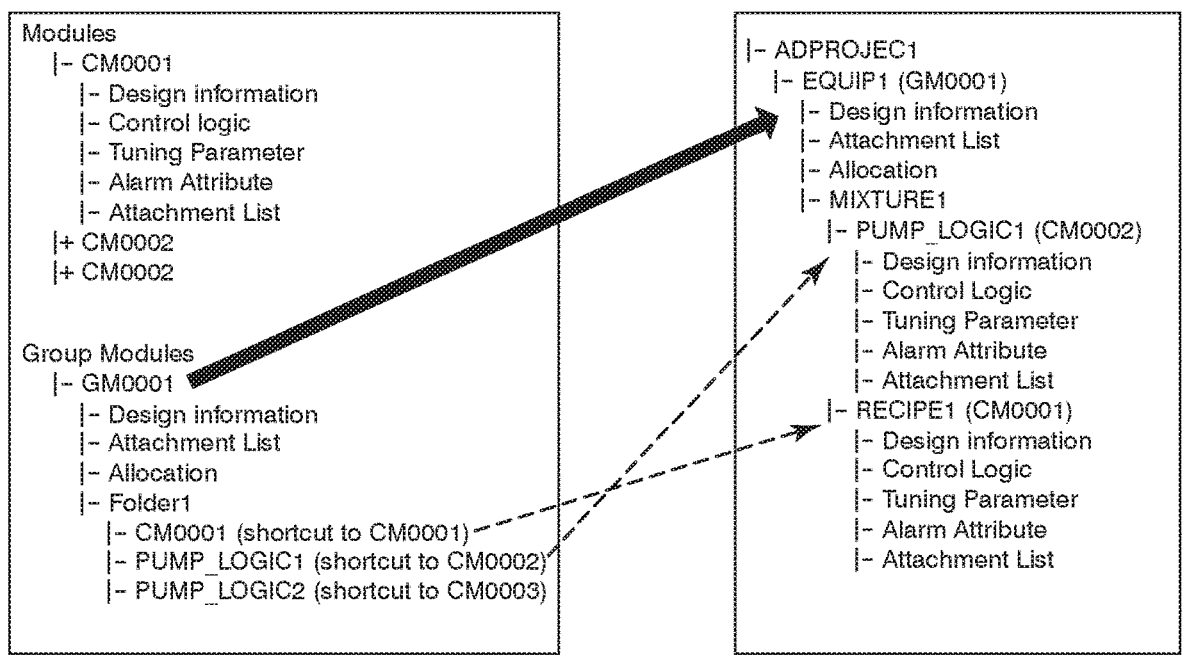
FIG. 11 shows a sample Scenario of module update for group application module.

FIG. 11 shows a sample Scenario of module update for group application module (group APM). This section describes a concrete example of module update for group APM. FIG. 11 shows an example of group class module GM0001 with Group APM EQUIP1. This group application module (group APM) is partially created with 2 out of 3 of Child Class Modules which belong to the group class module.

Allocation Settings

The following shows the configuration for its allocation settings from the Group Class Module and Group APM.

Allocation Settings in Group Class Module

| Module | Module Path | Group Number |
|---|---|---|
| CM0001 | Folder1¥ | 1 |
| PUMP_LOGIC1 | Folder1¥ | 1 |
| PUMP_LOGIC2 | Folder1¥ | 2 |

Allocation Settings in Group APM

| Module | Module Path | Group Number |
|---|---|---|
| PUMP_LOGIC1 | Folder1¥ | 1 |
| RECIPE1 | Folder1¥ | 1 |

Module Binding

This shows the module binding state of the Group APM which describes that its Group Number 1 is bound to FCS0101→DR0001.

| APM | Group Number | VP Project | FCS | Number |
|---|---|---|---|---|
| EQUIP1 | 1 | VPPJT1 | FCS0101 | 1 |

The following table describes the status of Module Update dialog given the user scenarios and the result of execution of module update.

1 Determining Status of Module Update Dialog and Update Result

| Scenario | Changes in Group Class Module | Status | Reason | Result of Module Update |
|---|---|---|---|---|
| Adding Child Class Folder and/or Child Class Module | GM0001 has been added with a new class folder "Folder2" | Latest | Changes in GM0001 does not affect the Child APMs in EQUIP1. There is no need to update the Group APM. | |
| | GM0001 has been added with a new class folder "Folder2" and some other Child Class Modules | Latest | Same as above. | |

-continued

| Scenario | Changes in Group Class Module | Status | Reason | Result of Module Update |
|---|---|---|---|---|
| | GM0001 has been added with a new class folder "Folder2" and CM0001 is moved under "Folder2". | Obsolete | Structure change is detected since it involved the Child Class Module (CM0001) being referred by RECIPE1. | Child application folder "Folder2" will be created and RECIPE1 will be moved under "Folder2". |
| Deleting Child Class Folder and/or Child Class Module | PUMP_LOGIC1 is deleted. | Obsolete | Child APM PUMP_LOGIC1 is referring to the Child Class Module. | Module update fails because PUMP_LOGIC1 which is assigned in Group Number 1 is bound to DR0001. User must unbind first. |
| | PUMP_LOGIC2 is deleted. | Latest | EQUIP1 has no Child APM referring to PUMP_LOGIC2. | |
| Renaming | GM00014 → Folder1 has been renamed to Folder A | Latest | Renaming the class folder is not considered as change in structure. | |
| | MIXTURE1 child application folder is renamed to "MIX A" | Latest | Renaming the child application folder is not considered as change in structure. | |
| | GM0001 is renamed to A_GM0001 | Latest | This is the same behavior as Class Module and Class based APM. | |
| Module Content change | CM0001 contents has been updated and was check-in. | Latest | Content updates of the source Class Module are out of scope in Group Module Update. These updates can be reflected using the Module Update dialog from Class Module. | |
| | Group Number of PUMP_LOGIC2 is changed | Latest | EQUIP1 has no Child APM referring to PUMP_LOGIC2. | |
| | Group Number is changed. CM0001 = 1 PUMP_LOGIC1 = 2 | Obsolete | Same as above | Module update fails because Group Number 1 is bound to DR0001. User must unbind first. |

In summary, it can be appreciated from the above-described embodiment, one of the most significant functions of the group class module-based engineering for automation design of an industrial plant is improvement in reusability. Reuse of the already tested group class modules can improve engineering quality and reduce engineering time and testing time wherein the already tested group class modules are revised in part and reused in part.

Each element or device for the game apparatus described above can be implemented by hardware with or without software. In some cases, the game apparatus may be implemented by one or more hardware processors and one or more software components wherein the one or more software components are to be executed by the one or more hardware processors to implement each element or device for the game apparatus. In some other cases, the game apparatus may be implemented by a system of circuits or circuitry configured to perform each operation of each element or device for the game apparatus.

The systems and methods in the above-described embodiments may be deployed in part or in whole through a machine or circuitry that executes computer software, software components, program codes, and/or instructions on one or more processors. The one or more processors may be part of a general-purpose computer, a server, a cloud server, a client, network infrastructure, mobile computing platform, stationary computing platform, or other computing platform. One or more processors may be any kind of computational or processing device or devices which are capable of executing program instructions, codes, binary instructions and the like. The one or more processors may be or include a signal processor, digital processor, embedded processor, microprocessor or any variants such as a co-processor, for example, math co-processor, graphic co-processor, communication co-processor and the like that may directly or indirectly facilitate execution of program codes or program instructions stored thereon. In addition, the one or more processors may enable execution of multiple programs, threads, and codes. The threads may be executed simultaneously to enhance the performance of the one or more processors and to facilitate simultaneous operations of the application. Program codes, program instructions and the like described herein may be implemented in one or more threads. The one or more processors may include memory that stores codes, instructions and programs as described herein. The processor may access a non-transitory processor-readable storage medium through an interface that may store codes, instructions and programs as described herein and elsewhere. The non-transitory processor-readable storage medium associated with the processor for storing programs, codes, program instructions or other type of instructions capable of being executed by the computing or processing device may include but may not be limited to one or more of a memory, hard disk, flash drive, RAM, ROM, CD-ROM, DVD, cache and the like.

A processor may include one or more cores that may enhance speed and performance of a multiprocessor. In some embodiments, the process may be a dual core processor, quad core processors, other chip-level multiprocessor and the like that combine two or more independent cores.

The methods and systems described herein may be deployed in part or in whole through a machine that executes computer software on a server, client, firewall, gateway, hub, router, or other such computer and/or networking hardware. The software program may be associated with one or more client that may include a file client, print client, domain client, internet client, intranet client and other variants such as secondary client, host client, distributed client and the like. The client may include one or more of memories, processors, computer readable media, storage media, physical and virtual ports, communication devices, and interfaces capable of accessing other clients, servers, machines, and devices through a wired or a wireless medium, and the like. The programs or codes as described herein may be executed by the client. In addition, other devices required for execution of methods as described in this application may be considered as a part of the infrastructure associated with the client. The client may provide an interface to other devices including servers, other clients, printers, database servers, print servers, file servers, communication servers, distributed servers and the like. This coupling and/or connection may facilitate remote execution of program across the network. The networking of some or all of these devices may facilitate parallel processing of a program or method at one or more location. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The software program may be associated with one or more servers that may include a file server, print server, domain server, internet server, intranet server and other variants such as secondary server, host server, distributed server and the like. The server may include one or more of memories, processors, computer readable media, storage media, physical and virtual ports, communication devices, and interfaces capable of accessing other servers, clients, machines, and devices through a wired or a wireless medium, and the like. The methods, programs or codes as described herein may be executed by the server. In addition, other devices required for execution of methods as described in this application may be considered as a part of the infrastructure associated with the server. The server may provide an interface to other devices including clients, other servers, printers, database servers, print servers, file servers, communication servers, distributed servers, social networks, and the like. This coupling and/or connection may facilitate remote execution of program across the network. The networking of some or all of these devices may facilitate parallel processing of a program or method at one or more locations. Any of the devices attached to the server through an interface may include at least one storage medium capable of storing programs, codes and/or instructions. A central repository may provide program instructions to be executed on different devices. In this implementation, the remote repository may act as a storage medium for program codes, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing devices associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements.

The methods, programs codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer to peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory, for example, USB sticks or keys, floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods, devices, apparatus, and systems described herein may transform physical and/or or intangible items from one state to another. The methods and systems described herein may also transform data representing physical and/or intangible items from one state to another.

The modules, engines, components, and elements described herein, including in flow charts and block diagrams throughout the figures, imply logical boundaries between the modules, engines, components, and elements. However, according to software or hardware engineering practices, the modules, engines, components, and elements and the functions thereof may be implemented on one or more processors, computers, machines through computer executable media, which are capable of executing program instructions stored thereon as a monolithic software structure, as standalone software modules, or as modules that employ external routines, codes, services, or any combination of these, and all such implementations may be within the scope of the present disclosure. Examples of such machines may include, but is not limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers, processor-embedded eyewear and the like. Furthermore, the modules, engines, components, and elements in the flow chart and block diagrams or any other logical component may be implemented on one or more machines, computers or processors capable of executing program instructions. Whereas the foregoing descriptions and drawings to which the descriptions have been referred set forth some functional aspects of the disclosed systems, no particular arrangement of software for implementing these functional aspects should be inferred from these descriptions unless explicitly stated or otherwise clear from the context. It will also be appreciated that the various steps identified and described above may be varied, and that the order of steps may be adapted to particular applications of the techniques disclosed herein. All such variations and modifications are intended to fall within the scope of this disclosure. The descriptions of an order for various steps should not be understood to require a particular order of execution for those steps, unless required by a particular application, or explicitly stated or otherwise clear from the context.

The methods and/or processes described above, and steps thereof, may be realized in hardware, software or any combination of hardware and software suitable for a particular application. The hardware may include a general purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine readable medium.

The computer executable code may be created using an object oriented programming language that may be stored, and compiled or interpreted to run on one of the above devices, as well as heterogeneous combinations of processors, processor architectures, or combinations of different hardware and software, or any other machine capable of executing program instructions.

Thus, in one aspect, each method described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While certain embodiments of the present inventions have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An industrial plant module-based engineering method comprising:

duplicating a source engineering template having one or more source child templates to create a duplicated engineering template having one or more duplicated child templates which correspond to the one or more source child templates, respectively, without duplicating any instances with one or more child instances which have been instantiated from the one or more source child templates in the source engineering template, wherein the duplicated engineering template is free of any instances and wherein each of the one or more child instances has an original link to the source engineering template;

selecting at least one child instance among one or more child instances which have been instantiated from the source engineering template, wherein the selected at least one child instance has an original link to the source engineering template; and changing the original link into a new link between the selected at least one child instance and the duplicated engineering template, wherein the selected at least one child instance has the new link to the duplicated engineering template and is free of the original link to the source engineering template, and wherein unselected one or more child instances remain to have the original link to the source engineering template.

2. The industrial plant module-based engineering method according to claim 1, further comprising:

instantiating the source engineering template having the one or more source child templates to create one or more instances which each have one or more child instances before duplicating the source engineering template having the one or more source child templates.

3. The industrial plant module-based engineering method according to claim 2, wherein the source engineering template having the one or more source child templates comprises a source group class module having one or more source child class modules which have links to a source class module, and wherein the one or more child instances, which have been instantiated from the source engineering template, comprise one or more child application modules having links to the source class module.

4. The industrial plant module-based engineering method according to claim 3, further comprising:

instantiating the source class module to create one or more class-based application modules which have links to the source class module.

5. The industrial plant module-based engineering method according to claim 4, further comprising:

duplicating the source class module to create a duplicated class module.

6. The industrial plant module-based engineering method according to claim 5, further comprising:

changing, after duplicating the source class module to have created a duplicated class module, the link between a selected class-based application module of the one or more class-based application modules and the source class module into a link between the selected class-based application module and the duplicated class module.

7. The industrial plant module-based engineering method according to claim 5, further comprising:

changing, after duplicating the source class module to have created the duplicated class module, the link between a selected child application module of the one or more child application modules and the source class module into a link between the selected child application module and the duplicated class module.

8. The industrial plant module-based engineering method according to claim 5, further comprising:

duplicating the source group class module having one or more source child class modules which have links to a source class module to create a duplicated group class module having the one or more duplicated child class modules which have links to the source class module.

9. The industrial plant module-based engineering method according to claim 8, further comprising:

instantiating the source group class module having the one or more source child class modules to create one or more group application modules which have links to the source group class module, wherein the one or more group application modules have one or more child application modules links to the source class module.

10. The industrial plant module-based engineering method according to claim 9, further comprising:

changing, after instantiating the source group class module to have created the one or more group application modules, the link between a selected group application module of the one or more group application modules and the source group class module into a link between the selected group application module and the duplicated group class module.

11. The industrial plant module-based engineering method according to claim 10, further comprising:

changing, after changing the link between the selected group application module and the source group class module into the link between the selected group application module and the duplicated group class module, the link between a selected child application module of the one or more child application modules of the selected group application module and the source child class module into a link between the selected child application module and the duplicated child class module.

12. The industrial plant module-based engineering method according to claim 11, further comprising:

changing, after duplicating the source class module to have created a duplicated class module, the link between a selected class-based application module of the one or more class-based application modules and the source class module into a link between the selected class-based application module and the duplicated class module.

13. The industrial plant module-based engineering method according to claim 12, further comprising:

changing, after duplicating the source class module to have created the duplicated class module, the link between a selected child application module of the one or more child application modules and the source class module into a link between the selected child application module and the duplicated class module.

14. The industrial plant module-based engineering method according to claim 9, wherein each group class module includes at least one allocation which defines:

i) groupings of a plurality of class modules; and
ii) assignments of the class modules to multiple drawings to define complex loops of multiple logical control module drawings.

15. The industrial plant module-based engineering method according to claim 14, wherein instantiating the source group class module comprises:

instantiating the source group class module with reflecting a hierarchy of the source group class modules to generate, in an application structure navigator, a group application module and a hierarchy of the group application module from the group class module; and instantiating the child class module to generate, in the application structure navigator, a child application module from the child class module.

16. The industrial plant module-based engineering method according to claim 15, further comprising:

updating the allocation of each group class module and a respective topology of the complex loops of each group class module, and the group module update engine configured to update an allocation of each group application module and a respective topology of the complex loops of each group application module.

17. The industrial plant module-based engineering method according to claim 16, further comprising:

binding, based on the at least one allocation of the group class module, the group application module and a legacy application module (legacy APM) to drawings of field controllers in an industrial plant, wherein the legacy application module is at least one of: iii) a class-based application module which refers to a source class module: and iv) a classless application module which does not refer to any source class module.

18. The industrial plant module-based engineering system according to claim 17, wherein each group class module has a plurality of child class modules, folders, and a hierarchy of the child class modules and the folders.

19. The industrial plant module-based engineering system according to claim 18, wherein each group class module comprises:

a design document information which is used to generate a document of module design;

an attachment which is used to store artifacts related to the class module; and the allocation which defines groupings of class modules and assignments of the class modules to plural control drawings to define complex loops for drawings of field control systems.

20. The industrial plant module-based engineering system according to claim 19, wherein the class module comprises:

a design document information which is used to generate a document of module design;

an attachment which is used to store artifacts related to the class module;

a control logic that contains a logic information of process control;

an alarm attribute; and turning parameters.

21. The industrial plant module-based engineering method according to claim 9, further comprising:

selecting part of the child class modules to be not instantiated, to generate a set of different group application modules from a single group class module.

22. The industrial plant module-based engineering method according to claim 9, further comprising:

assigning the multiple logical control drawings, which are defined in each group class module, to a respective one of a plurality of physical field control systems.

23. The industrial plant module-based engineering method according to claim 9, further comprising:

performing at least one of addition and deletion of the child application module which refers to the group application module that is instantiated from the group class module, in case that the group module update engine updates the respective topology of the complex loops of the group class module.

24. The industrial plant module-based engineering method according to claim 9, further comprising:

updating contents of the child application module which refers to the group application module that is instantiated from the group class module, in case that the group module update engine updates the respective topology of the complex loops of the group class module.

25. The industrial plant module-based engineering method according to claim 9, further comprising:

performing at least one of addition and deletion of the child application module which refers to the group application module that is instantiated from the group class module, in case that the group module update engine updates the respective topology of the complex loops of each group application module.

26. The industrial plant module-based engineering method according to claim 9, further comprising:

updating contents of the child application module which refers to the group application module that is instantiated from the group class module, in case that the group module update engine updates the respective topology of the complex loops of each group application module.

27. The industrial plant module-based engineering method according to claim 9, wherein each group application module includes at least one allocation which defines:

iii) groupings of application modules; and iv) assignments of the application modules to multiple control drawings to define complex loops of multiple logical control drawings.

28. The industrial plant module-based engineering method according to claim 9, further comprising:

updating the allocation of each group application module and the respective topology of the complex loops of each group application module if the group module update engine updated the allocation of each group class module and the respective topology of the complex loops of each group class module.

* * * * *